(12) United States Patent
Liu et al.

(10) Patent No.: US 8,895,942 B2
(45) Date of Patent: Nov. 25, 2014

(54) DIELECTRIC TREATMENT MODULE USING SCANNING IR RADIATION SOURCE

(75) Inventors: Junjun Liu, Austin, TX (US); Jacques Faguet, Albany, NY (US); Eric M. Lee, Austin, TX (US); Dorel I. Toma, Dripping Springs, TX (US); Hongyu Yue, Plano, TX (US)

(73) Assignee: Tokyo Electron Limited, Tokyo (JP)

( * ) Notice: Subject to any disclaimer, the term of this patent is extended or adjusted under 35 U.S.C. 154(b) by 1042 days.

(21) Appl. No.: 12/211,640

(22) Filed: Sep. 16, 2008

(65) Prior Publication Data

US 2010/0065759 A1    Mar. 18, 2010

(51) Int. Cl.
*H01L 21/67* (2006.01)
*B23K 26/08* (2014.01)
*B23K 26/12* (2014.01)
*C23C 16/56* (2006.01)

(52) U.S. Cl.
CPC ...... *H01L 21/67115* (2013.01); *B23K 26/0807* (2013.01); *B23K 26/12* (2013.01); *C23C 16/56* (2013.01); *B23K 26/127* (2013.01)
USPC ............. 250/492.1; 250/495.1; 250/504 R; 438/795

(58) Field of Classification Search
USPC .............. 250/495.1; 359/196.1; 438/795
See application file for complete search history.

(56) References Cited

U.S. PATENT DOCUMENTS

| | | | |
|---|---|---|---|
| 5,280,377 A * | 1/1994 | Chandler et al. | ........... 359/196.1 |
| 5,705,232 A | 1/1998 | Hwang et al. | |
| 5,710,407 A | 1/1998 | Moore et al. | |
| 6,232,248 B1 * | 5/2001 | Shinriki et al. | ............. 438/785 |
| 6,303,524 B1 | 10/2001 | Sharangpani et al. | |
| 6,407,012 B1 | 6/2002 | Miyasaka et al. | |
| 6,444,037 B1 | 9/2002 | Frankel et al. | |
| 6,596,467 B2 | 7/2003 | Gallagher et al. | |
| 6,689,218 B2 | 2/2004 | Potyralio et al. | |
| 6,692,903 B2 | 2/2004 | Chen et al. | |
| 6,756,085 B2 | 6/2004 | Waldfried et al. | |
| 6,764,718 B2 | 7/2004 | Nakamura et al. | |
| 6,786,974 B2 | 9/2004 | Komiya et al. | |
| 6,818,864 B2 | 11/2004 | Ptak | |
| 6,962,871 B2 | 11/2005 | Lee et al. | |
| 7,000,621 B1 | 2/2006 | Verhaverbeke | |
| 7,030,468 B2 | 4/2006 | Gates et al. | |

(Continued)

FOREIGN PATENT DOCUMENTS

| | | |
|---|---|---|
| JP | 63-004624 | 9/1988 |
| JP | 01-103824 | 4/1989 |

(Continued)

OTHER PUBLICATIONS

International Searching Authority, International Search Report and Written Opinion, International Application No. PCT/US09/56871, Mailed Mar. 3, 2010, 13 pages.

(Continued)

*Primary Examiner* — Jack Berman

(57) ABSTRACT

A system for curing a low dielectric constant (low-k) dielectric film on a substrate is described, wherein the dielectric constant of the low-k dielectric film is less than a value of approximately 4. The system comprises one or more process modules configured for exposing the low-k dielectric film to electromagnetic (EM) radiation, such as infrared (IR) radiation and ultraviolet (UV) radiation.

30 Claims, 20 Drawing Sheets

(56) References Cited

U.S. PATENT DOCUMENTS

| | | |
|---|---|---|
| 7,081,638 B1 | 7/2006 | Augur |
| 7,090,966 B2 | 8/2006 | Hirai et al. |
| 7,098,149 B2 | 8/2006 | Lukas et al. |
| 7,166,531 B1 | 1/2007 | Van Den Hoek et al. |
| 7,166,963 B2 | 1/2007 | Janos et al. |
| 7,199,330 B2 * | 4/2007 | DeMaria et al. ......... 219/121.76 |
| 7,223,670 B2 | 5/2007 | Callegari et al. |
| 7,282,458 B2 | 10/2007 | Gates et al. |
| 7,404,990 B2 | 7/2008 | Lukas et al. |
| 7,405,168 B2 | 7/2008 | Lee et al. |
| 7,622,378 B2 | 11/2009 | Liu et al. |
| 7,800,081 B2 * | 9/2010 | Moffatt et al. ............. 250/492.2 |
| 2002/0092472 A1 | 7/2002 | Hayashi et al. |
| 2003/0054115 A1 | 3/2003 | Albano et al. |
| 2003/0070690 A1 | 4/2003 | Danese |
| 2003/0224544 A1 | 12/2003 | Prisco et al. |
| 2004/0018319 A1 | 1/2004 | Waldfried et al. |
| 2004/0096593 A1 | 5/2004 | Lukas et al. |
| 2004/0096672 A1 | 5/2004 | Lukas et al. |
| 2004/0166628 A1 | 8/2004 | Park et al. |
| 2004/0175501 A1 | 9/2004 | Lukas et al. |
| 2004/0175957 A1 | 9/2004 | Lukas et al. |
| 2004/0253839 A1 * | 12/2004 | Shimizu et al. ............... 438/795 |
| 2005/0064726 A1 | 3/2005 | Reid et al. |
| 2005/0085094 A1 | 4/2005 | Yoo |
| 2005/0272220 A1 | 12/2005 | Waldfried et al. |
| 2006/0018639 A1 | 1/2006 | Ramamurthy et al. |
| 2006/0024976 A1 | 2/2006 | Waldfried et al. |
| 2006/0141806 A1 | 6/2006 | Waldfried et al. |
| 2006/0165904 A1 | 7/2006 | Ohara |
| 2006/0183345 A1 | 8/2006 | Nguyen et al. |
| 2006/0202311 A1 | 9/2006 | Nguyen et al. |
| 2006/0249078 A1 | 11/2006 | Nowak et al. |
| 2006/0251827 A1 | 11/2006 | Nowak et al. |
| 2006/0274405 A1 | 12/2006 | Waldfried et al. |
| 2007/0105401 A1 | 5/2007 | Liu et al. |
| 2007/0109003 A1 | 5/2007 | Shi et al. |
| 2007/0161230 A1 | 7/2007 | Chen et al. |
| 2007/0228289 A1 | 10/2007 | Kaszuba et al. |
| 2007/0228618 A1 | 10/2007 | Kaszuba et al. |
| 2007/0257205 A1 | 11/2007 | Rocha Alvarez et al. |
| 2007/0264786 A1 | 11/2007 | Chen et al. |
| 2007/0284698 A1 | 12/2007 | Callegari et al. |
| 2007/0286963 A1 | 12/2007 | Rocha Alvarez et al. |
| 2008/0063809 A1 | 3/2008 | Lee et al. |
| 2008/0067425 A1 | 3/2008 | Kaszuba et al. |
| 2009/0075491 A1 | 3/2009 | Liu et al. |

FOREIGN PATENT DOCUMENTS

| | | |
|---|---|---|
| JP | 05-062924 | 3/1993 |
| JP | WO99/34431 | 7/1999 |
| JP | 2005-032740 | 3/2005 |
| JP | 2005-005461 | 6/2005 |
| JP | 2006-203191 | 3/2006 |

OTHER PUBLICATIONS

Volksen et al., A Novel Post-Porosity Treatment for Significant Toughening of Low-k Organosilicates, IEEE, 2006, pp. 146-148.

Abell et al., Solid State MAS NMR Spectroscopic Characterization of Plasma Damage and UV Modification of Low K Dielectric Films, Mater. Res. Soc. Symp. Proc., vol. 863, Materials Research Society, 2005, pp. B1.8.1-B1.8.6.

Japanese Office Action issued in Application No. 2011-527032 mailed Jan. 28, 2014.

Japanese Office Action issued in Application No. 2011-527032 mailed Apr. 22, 2014.

* cited by examiner

DIELECTRIC TREATMENT MODULE USING SCANNING IR RADIATION SOURCE

CROSS-REFERENCE TO RELATED APPLICATIONS

This application is related to pending U.S. patent application Ser. No. 11/269,581, entitled "MULTI-STEP SYSTEM AND METHOD FOR CURING A DIELECTRIC FILM", filed on Nov. 9, 2005, and pending U.S. patent application Ser. No. 11/269,581, entitled "THERMAL PROCESSING SYSTEM FOR CURING DIELECTRIC FILMS", filed on Sep. 8, 2006. Further, this application is related to co-pending U.S. patent application Ser. No. 12/211 598, entitled "DIELECTRIC MATERIAL TREATMENT SYSTEM AND METHOD OF OPERATING" (TDC-011), filed on even date herewith; co-pending U.S. patent application Ser. No. 12/211, 675, entitled "IR LASER OPTICS SYSTEM FOR DIELECTRIC TREATMENT MODULE" (TDC-014), filed on even date herewith; and co-pending U.S. patent application Ser. No. 12/211,681, entitled "DIELECTRIC TREATMENT PLATFORM FOR DIELECTRIC FILM DEPOSITION AND CURING" (TDC-015), filed on even date herewith. The entire contents of these applications are herein incorporated by reference in their entirety.

BACKGROUND OF THE INVENTION

1. Field of the Invention

The invention relates to a system for treating a dielectric film and, more particularly, to a system for treating a low dielectric constant (low-k) dielectric film with electromagnetic (EM) radiation.

2. Description of Related Art

As is known to those in the semiconductor art, interconnect delay is a major limiting factor in the drive to improve the speed and performance of integrated circuits (IC). One way to minimize interconnect delay is to reduce interconnect capacitance by using low dielectric constant (low-k) materials as the insulating dielectric for metal wires in the IC devices. Thus, in recent years, low-k materials have been developed to replace relatively high dielectric constant insulating materials, such as silicon dioxide. In particular, low-k films are being utilized for inter-level and intra-level dielectric layers between metal wires in semiconductor devices. Additionally, in order to further reduce the dielectric constant of insulating materials, material films are formed with pores, i.e., porous low-k dielectric films. Such low-k films can be deposited by a spin-on dielectric (SOD) method similar to the application of photo-resist, or by chemical vapor deposition (CVD). Thus, the use of low-k materials is readily adaptable to existing semiconductor manufacturing processes.

Low-k materials are less robust than more traditional silicon dioxide, and the mechanical strength deteriorates further with the introduction of porosity. The porous low-k films can easily be damaged during plasma processing, thereby making desirable a mechanical strengthening process. It has been understood that enhancement of the material strength of porous low-k dielectrics is essential for their successful integration. Aimed at mechanical strengthening, alternative curing techniques are being explored to make porous low-k films more robust and suitable for integration.

The curing of a polymer includes a process whereby a thin film deposited for example using spin-on or vapor deposition (such as chemical vapor deposition CVD) techniques, is treated in order to cause cross-linking within the film. During the curing process, free radical polymerization is understood to be the primary route for cross-linking. As polymer chains cross-link, mechanical properties, such as for example the Young's modulus, the film hardness, the fracture toughness and the interfacial adhesion, are improved, thereby improving the fabrication robustness of the low-k film.

As there are various strategies to forming porous dielectric films with ultra low dielectric constant, the objectives of post-deposition treatments (curing) may vary from film to film, including for example the removal of moisture, the removal of solvents, the burn-out of porogens used to form the pores in the porous dielectric film, the improvement of the mechanical properties for such films, and so on.

Low dielectric constant (low k) materials are conventionally thermally cured at a temperature in the range of 300° C. to 400° C. for CVD films. For instance, furnace curing has been sufficient in producing strong, dense low-k films with a dielectric constant greater than approximately 2.5. However, when processing porous dielectric films (such as ultra low-k films) with a high level of porosity, the degree of cross-linking achievable with thermal treatment (or thermal curing) is no longer sufficient to produce films of adequate strength for a robust interconnect structure.

During thermal curing, an appropriate amount of energy is delivered to the dielectric film without damaging the dielectric film. Within the temperature range of interest, however, only a small amount of free radicals can be generated. Only a small amount of thermal energy can actually be absorbed in the low-k films to be cured due to the thermal energy lost in the coupling of heat to the substrate and the heat loss in the ambient environment. Therefore, high temperatures and long curing times are required for typical low-k furnace curing. But even with a high thermal budget, the lack of initiator generation in the thermal curing and the presence of a large amount of methyl termination in the as-deposited low-k film can make it very difficult to achieve the desired degree of cross-linking.

SUMMARY OF THE INVENTION

The invention relates to a system for treating a dielectric film and, more particularly, to a system for curing a low dielectric constant (low-k) dielectric film.

The invention further relates to a system for treating a low-k dielectric film with electromagnetic (EM) radiation.

According to an embodiment, a system for curing a low dielectric constant (low-k) dielectric film on a substrate is described, wherein the dielectric constant of the low-k dielectric film is less than a value of approximately 4. The system comprises an infrared (IR) radiation source and an ultraviolet (UV) radiation source for exposing the low-k dielectric film to IR radiation and UV radiation.

According to another embodiment, a process module for treating a dielectric film on a substrate is described. The process module comprises: a process chamber; a substrate holder coupled to the process chamber and configured to support a substrate; an infrared (IR) radiation source coupled to the process chamber and configured to expose the dielectric film to IR radiation, wherein the IR radiation source comprises one or more IR lasers; and a radiation scanning device coupled to the process chamber, and configured to scan one or more IR beams from the IR radiation source across the substrate.

DETAILED DESCRIPTION OF EXEMPLARY EMBODIMENTS

Figure 1:
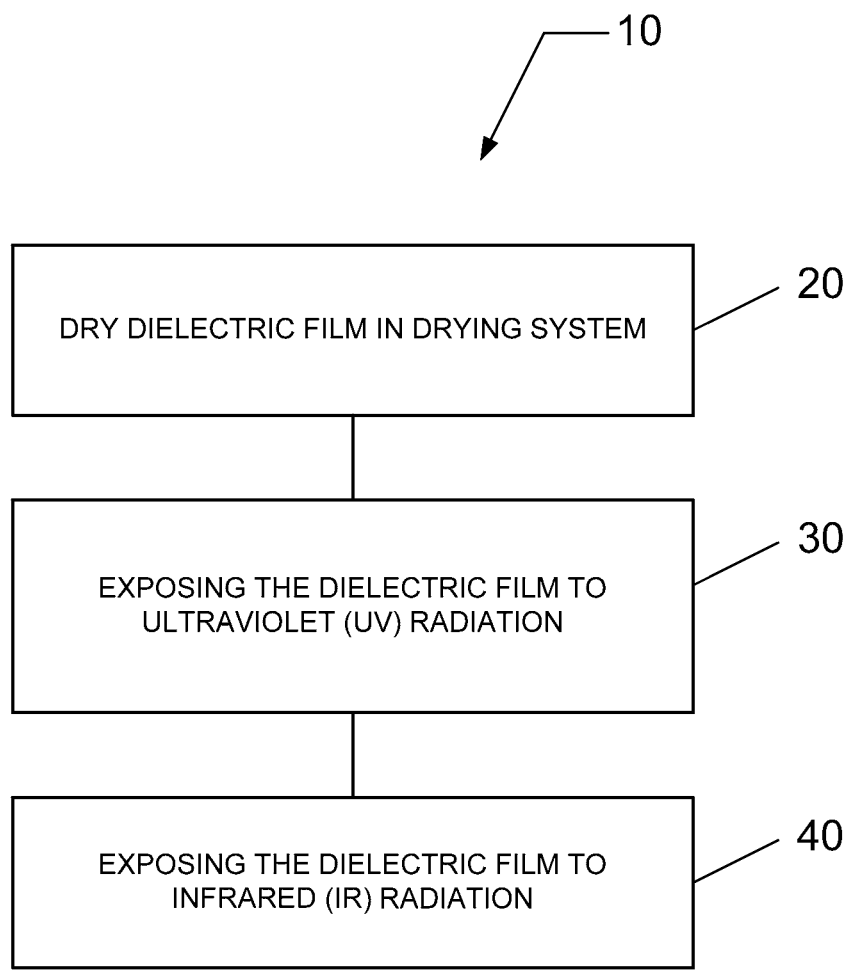
FIG. 1 illustrates a method of treating a dielectric film according to an embodiment.

In the following description, in order to facilitate a thorough understanding of the invention and for purposes of explanation and not limitation, specific details are set forth, such as a particular geometry of the processing system and descriptions of various components and processes. However, it should be understood that the invention may be practiced in other embodiments that depart from these specific details.

The inventors recognized that alternative curing methods address some of the deficiencies of thermal curing alone. For instance, alternative curing methods are more efficient in energy transfer, as compared to thermal curing processes, and the higher energy levels found in the form of energetic particles, such as accelerated electrons, ions, or neutrals, or in the form of energetic photons, can easily excite electrons in a low-k dielectric film, thus efficiently breaking chemical bonds and dissociating side groups. These alternative curing methods facilitate the generation of cross-linking initiators (free radicals) and can improve the energy transfer required in actual cross-linking As a result, the degree of cross-linking can be increased at a reduced thermal budget.

Additionally, the inventors have realized that, when film strength becomes a greater issue for the integration of low-k and ultra-low-k (ULK) dielectric films (dielectric constant less than approximately 2.5), alternative curing methods can improve the mechanical properties of such films. For example, electron beam (EB), ultraviolet (UV) radiation, infrared (IR) radiation and microwave (MW) radiation may be used to cure low-k films and ULK films in order to improve mechanical strength, while not sacrificing the dielectric property and film hydrophobicity.

However, although EB, UV, IR and MW curing all have their own benefits, these techniques also have limitations. High energy curing sources such as EB and UV can provide high energy levels to generate more than enough cross-linking initiators (free radicals) for cross-linking, which leads to much improved mechanical properties under complementary substrate heating. On the other hand, electrons and UV photons can cause indiscriminate dissociation of chemical bonds, which may adversely degrade the desired physical and electrical properties of the film, such as loss of hydrophobicity, increased residual film stress, collapse of pore structure, film densification and increased dielectric constant. Furthermore, low energy curing sources, such as MW curing, can provide significant improvements mostly in the heat transfer efficiency, but in the meantime have side effects, such as for example arcing or transistor damage.

According to an embodiment, a method of curing a low dielectric constant (low-k) dielectric film on a substrate is described, wherein the dielectric constant of the low-k dielectric film is less than a value of approximately 4. The method comprises exposing the low-k dielectric film to non-ionizing, electromagnetic (EM) radiation, including UV radiation and IR radiation. The UV exposure may comprise a plurality of UV exposures, wherein each UV exposure may or may not include a different intensity, power, power density, or wavelength range, or any combination of two or more thereof. The IR exposure may comprise a plurality of IR exposures, wherein each IR exposure may or may not include a different intensity, power, power density, or wavelength range, or any combination of two or more thereof.

During the UV exposure, the low-k dielectric film may be heated by elevating the temperature of the substrate to a UV thermal temperature ranging from approximately 100 degrees C. to approximately 600 degrees C. Alternatively, the UV thermal temperature ranges from approximately 300 degrees C. to approximately 500 degrees C. Alternatively, the UV thermal temperature ranges from approximately 350 degrees C. to approximately 450 degrees C. Substrate thermal heating may be performed by conductive heating, convective heating, or radiative heating, or any combination of two or more thereof.

During the IR exposure, the low-k dielectric film may be heated by elevating the temperature of the substrate to an IR thermal temperature ranging from approximately 100 degrees C. to approximately 600 degrees C. Alternatively, the IR thermal temperature ranges from approximately 300 degrees C. to approximately 500 degrees C. Alternatively, the IR thermal temperature ranges from approximately 350 degrees C. to approximately 450 degrees C. Substrate thermal heating may be performed by conductive heating, convective heating, or radiative heating, or any combination of two or more thereof.

Additionally, thermal heating may take place before UV exposure, during UV exposure, or after UV exposure, or any combination of two or more thereof. Additionally yet, thermal heating may take place before IR exposure, during IR exposure, or after IR exposure, or any combination of two or more thereof. Thermal heating may be performed by conductive heating, convective heating, or radiative heating, or any combination of two or more thereof.

Further, IR exposure may take place before the UV exposure, during the UV exposure, or after the UV exposure, or any combination of two or more thereof. Further yet, UV exposure may take place before the IR exposure, during the IR exposure, or after the IR exposure, or any combination of two or more thereof.

Preceding the UV exposure or the IR exposure or both, the low-k dielectric film may be heated by elevating the temperature of the substrate to a pre-thermal treatment temperature ranging from approximately 100 degrees C. to approximately 600 degrees C. Alternatively, the pre-thermal treatment temperature ranges from approximately 300 degrees C. to approximately 500 degrees C. and, desirably, the pre-thermal treatment temperature ranges from approximately 350 degrees C. to approximately 450 degrees C.

Following the UV exposure or the IR exposure or both, the low-k dielectric film may be heated by elevating the temperature of the substrate to a post-thermal treatment temperature ranging from approximately 100 degrees C. to approximately 600 degrees C. Alternatively, the post-thermal treatment temperature ranges from approximately 300 degrees C. to approximately 500 degrees C. and, desirably, the post-thermal treatment temperature ranges from approximately 350 degrees C. to approximately 450 degrees C.

Referring now to FIG. 1, a method of treating a dielectric film on a substrate is described according to another embodiment. The substrate to be treated may be a semiconductor, a metallic conductor, or any other substrate to which the dielectric film is to be formed upon. The dielectric film can have a dielectric constant value (before drying and/or curing, or after drying and/or curing, or both) less than the dielectric constant of $SiO_2$, which is approximately 4 (e.g., the dielectric constant for thermal silicon dioxide can range from 3.8 to 3.9). In various embodiments of the invention, the dielectric film may have a dielectric constant (before drying and/or curing, or after drying and/or curing, or both) of less than 3.0, a dielectric constant of less than 2.5, a dielectric constant of less than 2.2, or a dielectric constant of less than 1.7.

The dielectric film may be described as a low dielectric constant (low-k) film or an ultra-low-k film. The dielectric film may include at least one of an organic, inorganic, and inorganic-organic hybrid material. Additionally, the dielectric film may be porous or non-porous.

The dielectric film may, for instance, include a single phase or dual phase porous low-k film that includes a structure-forming material and a pore-generating material. The structure-forming material may include an atom, a molecule, or fragment of a molecule that is derived from a structure-forming precursor. The pore-generating material may include an atom, a molecule, or fragment of a molecule that is derived from a pore-generating precursor (e.g., porogen). The single phase or dual phase porous low-k film may have a higher dielectric constant prior to removal of the pore-generating material than following the removal of the pore-generating material.

For example, forming a single phase porous low-k film may include depositing a structure-forming molecule having a pore-generating molecular side group weakly bonded to the structure-forming molecule on a surface of a substrate. Additionally, for example, forming a dual phase porous low-k film may include co-polymerizing a structure-forming molecule and a pore-generating molecule on a surface of a substrate.

Additionally, the dielectric film may have moisture, water, solvent, and/or other contaminants which cause the dielectric constant to be higher prior to drying and/or curing than following drying and/or curing.

The dielectric film can be formed using chemical vapor deposition (CVD) techniques, or spin-on dielectric (SOD) techniques such as those offered in the CLEAN TRACK ACT 8 SOD (a spin coating machine for semiconductor processing) and CLEAN TRACK ACT 12 SOD (a spin coating machine for semiconductor processing) coating systems commercially available from Tokyo Electron Limited (TEL). The CLEAN TRACK ACT 8 (200 mm) and CLEAN TRACK ACT 12 (300 mm) coating systems provide coat, bake, and cure tools for SOD materials. The track system can be configured for processing substrate sizes of 100 mm, 200 mm, 300 mm, and greater. Other systems and methods for forming a dielectric film on a substrate as known to those skilled in the art of both spin-on dielectric technology and CVD dielectric technology are suitable for the invention.

For example, the dielectric film may include an inorganic, silicate-based material, such as oxidized organosilane (or organo siloxane), deposited using CVD techniques. Examples of such films include BLACK DIAMOND CVD organosilicate glass (OSG) films (insulating material for semiconductor processing) commercially available from Applied Materials, Inc., or CORAL CVD films (insulating material for semiconductor processing) commercially available from Novellus Systems, Inc.

Additionally, for example, porous dielectric films can include single-phase materials, such as a silicon oxide-based matrix having terminal organic side groups that inhibit cross-linking during a curing process to create small voids (or pores). Additionally, for example, porous dielectric films can include dual-phase materials, such as a silicon oxide-based matrix having inclusions of organic material (e.g., a porogen) that is decomposed and evaporated during a curing process.

Alternatively, the dielectric film may include an inorganic, silicate-based material, such as hydrogen silsesquioxane (HSQ) or methyl silsesquioxane (MSQ), deposited using SOD techniques. Examples of such films include FOx® HSQ (insulating material for semiconductor processing) commercially available from Dow Corning Corporation, XLK porous HSQ (insulating material for semiconductor processing) commercially available from Dow Corning Corporation, and JSR LKD-5109 (insulating material for semiconductor processing) commercially available from JSR Microelectronics.

Still alternatively, the dielectric film can include an organic material deposited using SOD techniques. Examples of such films include SILK-I, SILK-J, SILK-H, SILK-D, porous SILK-T, porous SILK-Y, and porous SILK-Z semiconductor dielectric resins (insulating materials for semiconductor processing) commercially available from Dow Chemical Company, and FLARE and NANOGLASS (insulating materials for semiconductor processing) commercially available from Honeywell International, Inc.

The method includes a flow chart 10 beginning in 20 with optionally drying the dielectric film on the substrate in a first processing system. The first processing system may include a drying system configured to remove, or partially remove, one or more contaminants in the dielectric film, including, for example, moisture, water, solvent, pore-generating material, residual pore-generating material, pore-generating molecules, fragments of pore-generating molecules, or any other contaminant that may interfere with a subsequent curing process.

In 30, the dielectric film is exposed to UV radiation. The UV exposure may be performed in a second processing system. The second processing system may include a curing system configured to perform a UV-assisted cure of the dielectric film by causing or partially causing cross-linking within the dielectric film in order to, for example, improve the mechanical properties of the dielectric film. Following the drying process, the substrate can be transferred from the first processing system to the second processing system under vacuum in order to minimize contamination.

The exposure of the dielectric film to UV radiation may include exposing the dielectric film to UV radiation from one or more UV lamps, one or more UV LEDs (light-emitting diodes), or one or more UV lasers, or a combination of two or more thereof. The UV radiation may range in wavelength from approximately 100 nanometers (nm) to approximately 600 nm. Alternatively, the UV radiation may range in wavelength from approximately 150 nm to approximately 400 nm. Alternatively, the UV radiation may range in wavelength from approximately 150 nm to approximately 300 nm. Alternatively, the UV radiation may range in wavelength from approximately 170 nm to approximately 240 nm. Alternatively, the UV radiation may range in wavelength from approximately 200 nm to approximately 240 nm.

During the exposure of the dielectric film to UV radiation, the dielectric film may be heated by elevating the temperature of the substrate to a UV thermal temperature ranging from approximately 100 degrees C. to approximately 600 degrees C. Alternatively, the UV thermal temperature can range from approximately 300 degrees C. to approximately 500 degrees C. Alternatively, the UV thermal temperature can range from approximately 350 degrees C. to approximately 450 degrees C. Alternatively, before the exposure of the dielectric film to UV radiation or after the exposure of the dielectric film to UV radiation or both, the dielectric film may be heated by elevating the temperature of the substrate. Heating of the substrate may include conductive heating, convective heating, or radiative heating, or any combination of two or more thereof.

Optionally, during the exposure of the dielectric film to UV radiation, the dielectric film may be exposed to IR radiation. The exposure of the dielectric film to IR radiation may include exposing the dielectric film to IR radiation from one or more IR lamps, one or more IR LEDs (light emitting diodes), or one or more IR lasers, or a combination of two or more thereof. The IR radiation may range in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns.

In 40, the dielectric film is exposed to IR radiation. The exposure of the dielectric film to IR radiation may include exposing the dielectric film to IR radiation from one or more IR lamps, one or more IR LEDs (light emitting diodes), or one or more IR lasers, or both. The IR radiation may range in wavelength from approximately 1 micron to approximately 25 microns. Alternatively, the IR radiation may range in wavelength from approximately 2 microns to approximately 20 microns. Alternatively, the IR radiation may range in wavelength from approximately 8 microns to approximately 14 microns. Alternatively, the IR radiation may range in wavelength from approximately 8 microns to approximately 12 microns. Alternatively, the IR radiation may range in wavelength from approximately 9 microns to approximately 10 microns. The IR exposure may take place before the UV exposure, during the UV exposure, or after the UV exposure, or any combination of two or more thereof.

Furthermore, during the exposure of the dielectric film to IR radiation, the dielectric film may be heated by elevating the temperature of the substrate to an IR thermal treatment temperature ranging from approximately 100 degrees C. to approximately 600 degrees C. Alternatively, the IR thermal treatment temperature can range from approximately 300 degrees C. to approximately 500 degrees C. Alternatively yet, the IR thermal treatment temperature can range from approximately 350 degrees C. to approximately 450 degrees C. Alternatively, before the exposure of the dielectric film to IR radiation or after the exposure of the dielectric film to IR radiation or both, the dielectric film may be heated by elevating the temperature of the substrate. Heating of the substrate may include conductive heating, convective heating, or radiative heating, or any combination of two or more thereof.

As described above, during the IR exposure, the dielectric film may be heated through absorption of IR energy. However, the heating may further include conductively heating the substrate by placing the substrate on a substrate holder, and heating the substrate holder using a heating device. For example, the heating device may include a resistive heating element.

The inventors have recognized that the energy level (hv) delivered can be varied during different stages of the curing process. The curing process can include mechanisms for the removal of moisture and/or contaminants, the removal of pore-generating material, the decomposition of pore-generating material, the generation of cross-linking initiators, the cross-linking of the dielectric film, and the diffusion of the cross-linking initiators. Each mechanism may require a different energy level and rate at which energy is delivered to the dielectric film.

For instance, during the removal of pore-generating material, the removal process may be facilitated by photon absorption at IR wavelengths. The inventors have discovered that IR exposure assists the removal of pore-generating material more efficiently than thermal heating or UV exposure.

Additionally, for instance, during the removal of pore-generating material, the removal process may be assisted by decomposition of the pore-generating material. The removal process may include IR exposure that is complemented by UV exposure. The inventors have discovered that UV exposure may assist a removal process having IR exposure by dissociating bonds between pore-generating material (e.g., pore-generating molecules and/or pore-generating molecular fragments) and the structure-forming material. For example, the removal and/or decomposition processes may be assisted by photon absorption at UV wavelengths (e.g., about 300 nm to about 450 nm).

Furthermore, for instance, during the generation of cross-linking initiators, the initiator generation process may be facilitated by using photon and phonon induced bond dissociation within the structure-forming material. The inventors have discovered that the initiator generation process may be facilitated by UV exposure. For example, bond dissociation can require energy levels having a wavelength less than or equal to approximately 300 to 400 nm.

Further yet, for instance, during cross-linking, the cross-linking process can be facilitated by thermal energy sufficient for bond formation and reorganization. The inventors have discovered that cross-linking may be facilitated by IR exposure or thermal heating or both. For example, bond formation and reorganization may require energy levels having a wavelength of approximately 9 microns which, for example, corresponds to the main absorbance peak in siloxane-based organosilicate low-k materials.

The drying process for the dielectric film, the IR exposure of the dielectric film, and the UV exposure of the dielectric film may be performed in the same processing system, or each may be performed in separate processing systems. For example, the drying process may be performed in the first processing system and the IR exposure and the UV exposure may be performed in the second processing system. Alternatively, for example, the IR exposure of the dielectric film may be performed in a different processing system than the UV exposure. The IR exposure of the dielectric film may be performed in a third processing system, wherein the substrate can be transferred from the second processing system to the third processing system under vacuum in order to minimize contamination.

Additionally, following the optional drying process, the UV exposure process, and the IR exposure process, the dielectric film may optionally be post-treated in a post-treatment system configured to modify the cured dielectric film. For example, post-treatment may include thermal heating the dielectric film. Alternatively, for example, post-treatment may include spin coating or vapor depositing another film on the dielectric film in order to promote adhesion for subsequent films or improve hydrophobicity. Alternatively, for example, adhesion promotion may be achieved in a post-treatment system by lightly bombarding the dielectric film with ions. Moreover, the post-treatment may comprise performing one or more of depositing another film on the dielectric film, cleaning the dielectric film, or exposing the dielectric film to plasma.

Figure 2:
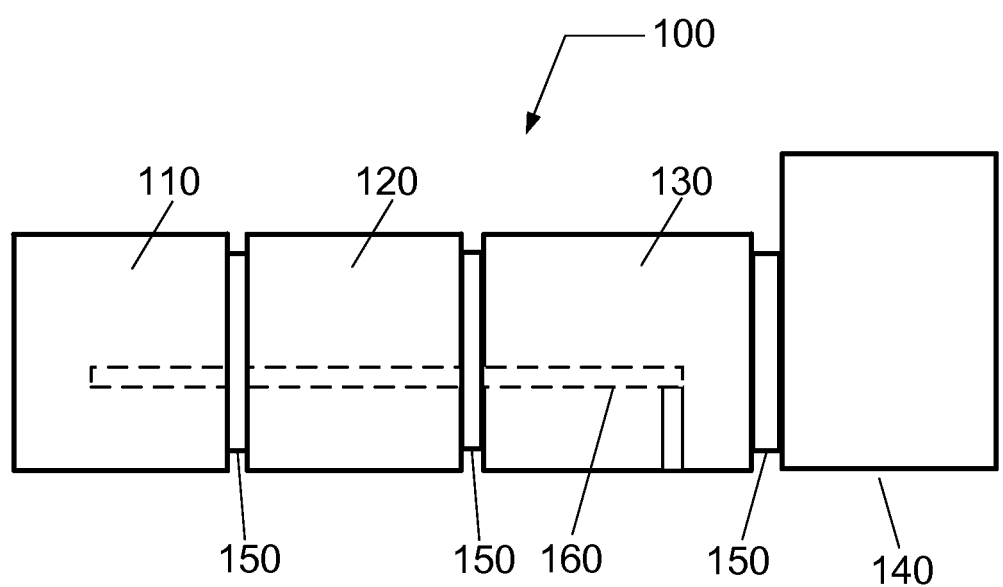
FIG. 2 illustrates a side view schematic representation of a transfer system for a treatment system according to an embodiment.
Figure 3:
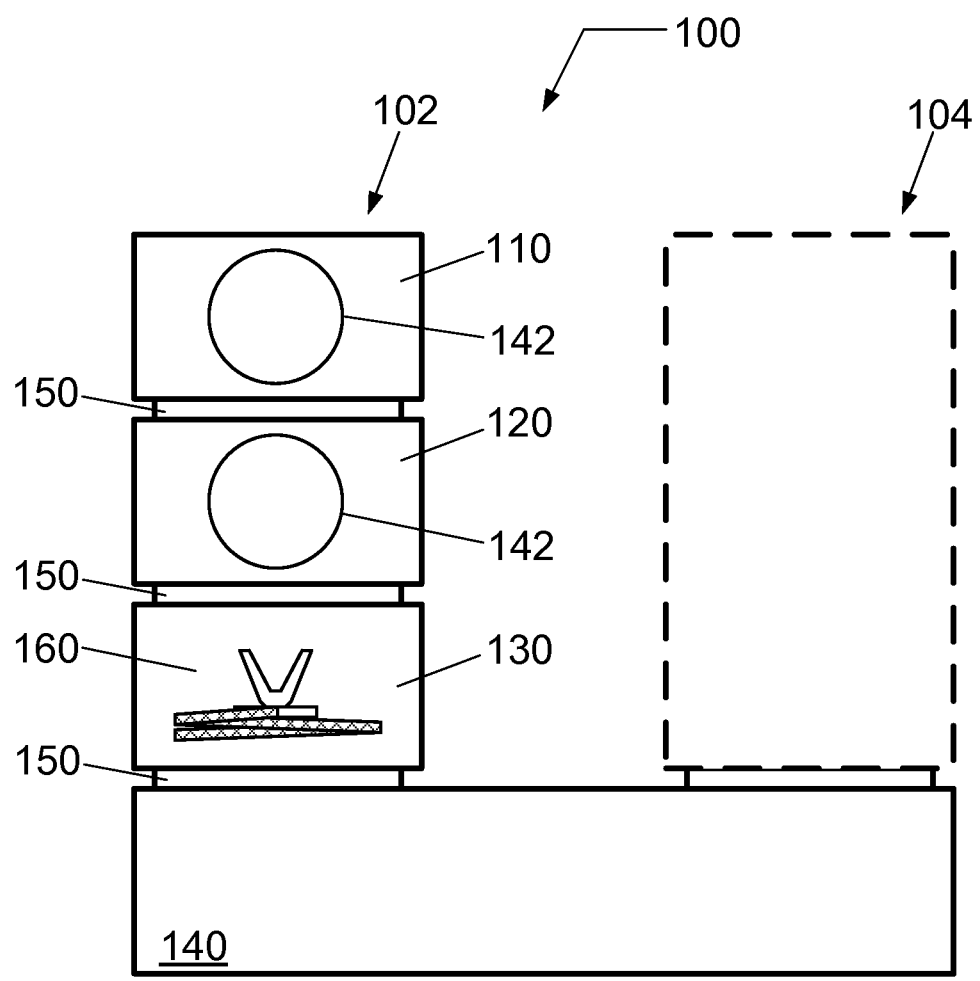
FIG. 3 illustrates a top view schematic representation of the transfer system depicted in FIG. 2.

According to one embodiment, FIGS. 2 and 3 provide a side view and top view, respectively, of a process platform 100 for treating a dielectric film on a substrate. The process platform 100 includes a first process module 110 and a second process module 120. The first process module 110 may comprise a curing system and the second process module 120 may comprise a drying system.

The drying system may be configured to remove, or reduce to sufficient levels, one or more contaminants, pore-generating materials, and/or cross-linking inhibitors in the dielectric film, including, for example, moisture, water, solvent, contaminants, pore-generating material, residual pore-generating material, a weakly bonded side group to the structure-forming material, pore-generating molecules, fragments of pore-generating molecules, cross-linking inhibitors, fragments of cross-linking inhibitors, or any other contaminant that may interfere with a curing process performed in the curing system.

For example, a sufficient reduction of a specific contaminant present within the dielectric film, from prior to the drying process to following the drying process, can include a reduction of approximately 10% to approximately 100% of the specific contaminant. The level of contaminant reduction may be measured using Fourier transform infrared (FTIR) spectroscopy, or mass spectroscopy. Alternatively, for example, a sufficient reduction of a specific contaminant present within the dielectric film can range from approximately 50% to approximately 100%. Alternatively, for example, a sufficient reduction of a specific contaminant present within the dielectric film can range from approximately 80% to approximately 100%.

Referring still to FIG. 2, the curing system may be configured to cure the dielectric film by causing or partially causing cross-linking within the dielectric film in order to, for example, improve the mechanical properties of the dielectric film. Furthermore, the curing system may be configured to cure the dielectric film by causing or partially causing cross-link initiation, removal of pore-generating material, decomposition of pore-generating material, etc. The curing system can include one or more radiation sources configured to expose the substrate having the dielectric film to EM radiation at multiple EM wavelengths. For example, the one or more radiation sources can include an IR radiation source and a UV radiation source. The exposure of the substrate to UV radiation and IR radiation may be performed simultaneously, sequentially, or partially over-lapping one another. During sequential exposure, the exposure of the substrate to UV radiation can, for instance, precede the exposure of the substrate to IR radiation or follow the exposure of the substrate to IR radiation or both. Additionally, during sequential exposure, the exposure of the substrate to IR radiation can, for instance, precede the exposure of the substrate to UV radiation or follow the exposure of the substrate to UV radiation or both.

For example, the IR radiation can include an IR radiation source ranging from approximately 1 micron to approximately 25 microns. Additionally, for example, the IR radiation may range from about 2 microns to about 20 microns, or from about 8 microns to about 14 microns, or from about 8 microns to about 12 microns, or from about 9 microns to about 10 microns. Additionally, for example, the UV radiation can include a UV wave-band source producing radiation ranging from approximately 100 nanometers (nm) to approximately 600 nm. Furthermore, for example, the UV radiation may range from about 150 nm to about 400 nm, or from about 150 nm to about 300 nm, or from about 170 to about 240 nm, or from about 200 nm to about 240 nm.

Alternatively, the first process module 110 may comprise a first curing system configured to expose the substrate to UV radiation, and the second process module 120 may comprise a second curing system configured to expose the substrate to IR radiation.

IR exposure of the substrate can be performed in the first process module 110, or the second process module 120, or a separate process module (not shown).

Also, as illustrated in FIGS. 2 and 3, a transfer system 130 can be coupled to the second process module 120 in order to transfer substrates into and out of the first process module 110 and the second process module 120, and exchange substrates with a multi-element manufacturing system 140. Transfer system 130 may transfer substrates to and from the first process module 110 and the second process module 120 while maintaining a vacuum environment.

The first and second process modules 110, 120, and the transfer system 130 can, for example, include a processing element within the multi-element manufacturing system 140. The transfer system 130 may comprise a dedicated substrate handler 160 for moving a one or more substrates between the first process module 110, the second process module 120, and the multi-element manufacturing system 140. For example, the dedicated substrate handler 160 is dedicated to transferring the one or more substrates between the process modules (first process module 110 and second process module 120), and the multi-element manufacturing system 140; however, the embodiment is not so limited.

For example, the multi-element manufacturing system 140 may permit the transfer of substrates to and from processing elements including such devices as etch systems, deposition systems, coating systems, patterning systems, metrology systems, etc. As an example, the deposition system may include one or more vapor deposition systems, each of which is configured to deposit a dielectric film on a substrate, wherein the dielectric film comprises a porous dielectric film, a non-porous dielectric film, a low dielectric constant (low-k) film, or an ultra low-k film. In order to isolate the processes occurring in the first and second systems, an isolation assembly 150 can be utilized to couple each system. For instance, the isolation assembly 150 can include at least one of a thermal insulation assembly to provide thermal isolation, and a gate valve assembly to provide vacuum isolation. The first and second process modules 110 and 120, and transfer system 130 can be placed in any sequence.

FIG. 3 presents a top-view of the process platform 100 illustrated in FIG. 2 for processing one or more substrates. In this embodiment, a substrate 142 is processed in the first and second process modules 110, 120. Although only one substrate is shown in each treatment system in FIG. 3, two or more substrates may be processed in parallel in each process module.

Referring still to FIG. 3, the process platform 100 may comprise a first process element 102 and a second process element 104 configured to extend from the multi-element manufacturing system 140 and work in parallel with one another. As illustrated in FIGS. 2 and 3, the first process element 102 may comprise first process module 110 and second process module 120, wherein a transfer system 130 utilizes the dedicated substrate handler 160 to move substrate 142 into and out of the first process element 102.

Figure 4:
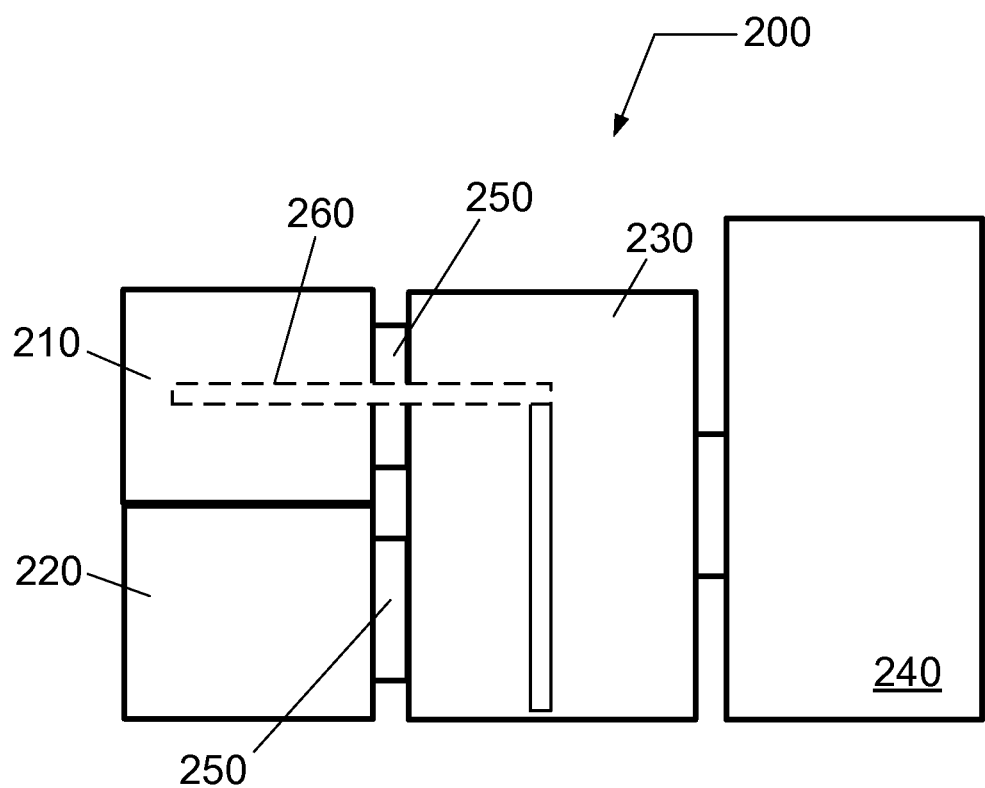
FIG. 4 illustrates a side view schematic representation of a transfer system for a treatment system according to another embodiment.

Alternatively, FIG. 4 presents a side-view of a process platform 200 for processing one or more substrates according to another embodiment. Process platform 200 may be configured for treating a dielectric film on a substrate.

The process platform 200 comprises a first process module 210, and a second process module 220, wherein the first process module 210 is stacked atop the second process module 220 in a vertical direction as shown. The first process module 210 may comprise a curing system, and the second process module 220 may comprise a drying system. Alternatively, the first process module 210 may comprise a first curing system configured to expose the substrate to UV radiation, and the second process module 220 may comprise a second curing system configured to expose the substrate to IR radiation.

Also, as illustrated in FIG. 4, a transfer system 230 may be coupled to the first process module 210, in order to transfer substrates into and out of the first process module 210, and coupled to the second process module 220, in order to transfer substrates into and out of the second process module 220. The transfer system 230 may comprise a dedicated handler 260 for moving one or more substrates between the first process module 210, the second process module 220 and the multi-element manufacturing system 240. The handler 260 may be dedicated to transferring the substrates between the process modules (first process module 210 and second process module 220) and the multi-element manufacturing system 240; however, the embodiment is not so limited.

Additionally, transfer system 230 may exchange substrates with one or more substrate cassettes (not shown). Although only two process modules are illustrated in FIG. 4, other process modules can access transfer system 230 or multi-element manufacturing system 240 including such devices as etch systems, deposition systems, coating systems, patterning systems, metrology systems, etc. As an example, the deposition system may include one or more vapor deposition systems, each of which is configured to deposit a dielectric film on a substrate, wherein the dielectric film comprises a porous dielectric film, a non-porous dielectric film, a low dielectric constant (low-k) film, or an ultra low-k film. An isolation assembly 250 can be used to couple each process module in order to isolate the processes occurring in the first and second process modules. For instance, the isolation assembly 250 may comprise at least one of a thermal insulation assembly to provide thermal isolation, and a gate valve assembly to provide vacuum isolation. Additionally, for example, the transfer system 230 can serve as part of the isolation assembly 250.

Figure 5:
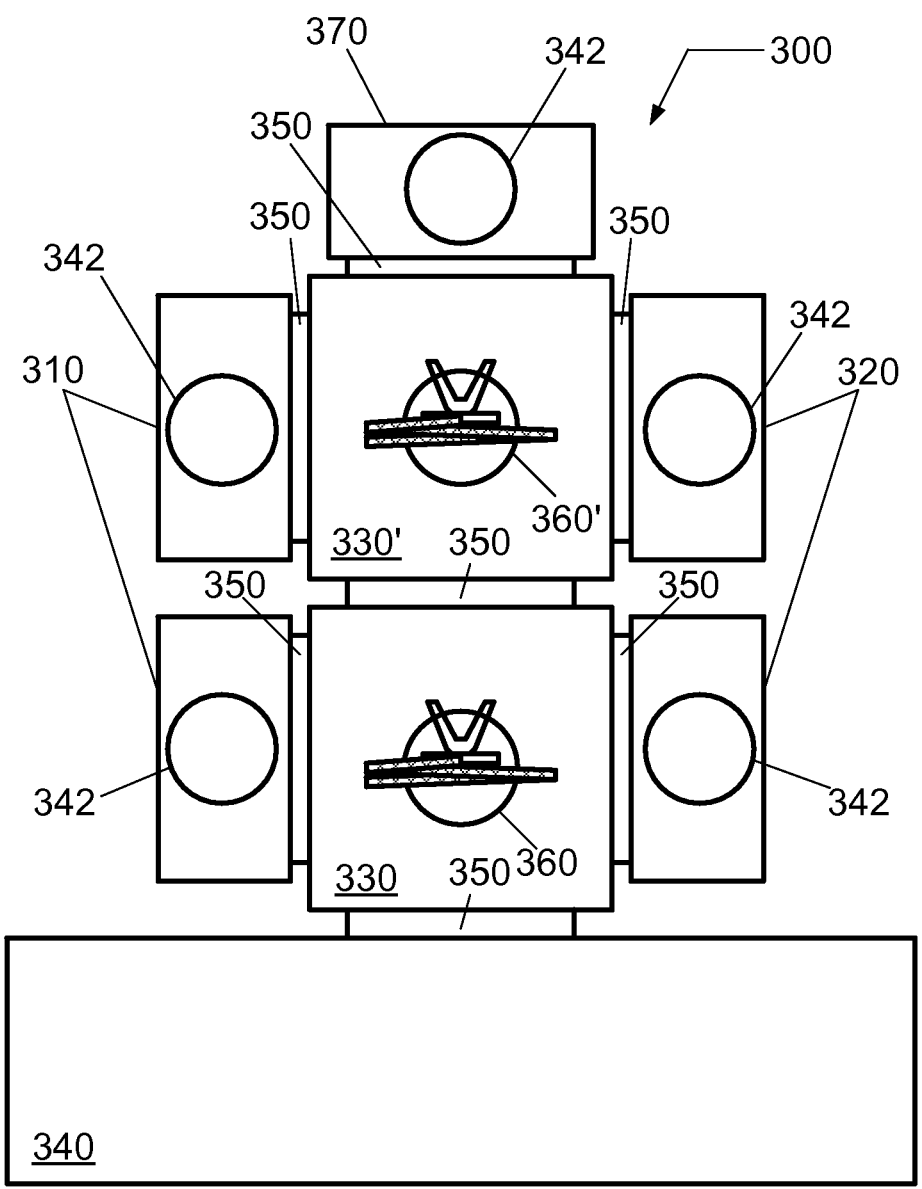
FIG. 5 illustrates a top view schematic representation of a transfer system for a treatment system according to another embodiment.

According to another embodiment, FIG. 5 presents a top view of a process platform 300 for processing a plurality of substrates. Process platform 300 may be configured for treating a dielectric film on a substrate.

The process platform 300 comprises a first process module 310, a second process module 320, and an optional auxiliary process module 370 coupled to a first transfer system 330 and an optional second transfer system 330'. The first process module 310 may comprise a curing system, and the second process module 320 may comprise a drying system. Alternatively, the first process module 310 may comprise a first curing system configured to expose the substrate to UV radiation, and the second process module 320 may comprise a second curing system configured to expose the substrate to IR radiation.

Also, as illustrated in FIG. 5, the first transfer system 330 and the optional second transfer system 330' are coupled to the first process module 310 and the second process module 320, and configured to transfer one or more substrates in and out of the first process module 310 and the second process module 320, and also to exchange one or more substrates with a multi-element manufacturing system 340. The multi-element manufacturing system 340 may comprise a load-lock element to allow cassettes of substrates to cycle between ambient conditions and low pressure conditions.

The first and second treatment systems 310, 320, and the first and optional second transfer systems 330, 330' can, for example, comprise a processing element within the multi-element manufacturing system 340. The transfer system 330 may comprise a first dedicated handler 360 and the optional second transfer system 330' comprises an optional second dedicated handler 360' for moving one or more substrates between the first process module 310, the second process module 320, the optional auxiliary process module 370 and the multi-element manufacturing system 340.

In one embodiment, the multi-element manufacturing system 340 may permit the transfer of substrates to and from processing elements including such devices as etch systems, deposition systems, coating systems, patterning systems, metrology systems, etc. Furthermore, the multi-element manufacturing system 340 may permit the transfer of substrates to and from the auxiliary process module 370, wherein the auxiliary process module 370 may include an etch system, a deposition system, a coating system, a patterning system, a metrology system, etc. As an example, the deposition system may include one or more vapor deposition systems, each of which is configured to deposit a dielectric film on a substrate, wherein the dielectric film comprises a porous dielectric film, a non-porous dielectric film, a low dielectric constant (low-k) film, or an ultra low-k film.

In order to isolate the processes occurring in the first and second process modules, an isolation assembly 350 is utilized to couple each process module. For instance, the isolation assembly 350 may comprise at least one of a thermal insulation assembly to provide thermal isolation and a gate valve assembly to provide vacuum isolation. Of course, process modules 310 and 320, and transfer systems 330 and 330' may be placed in any sequence.

Figure 6:
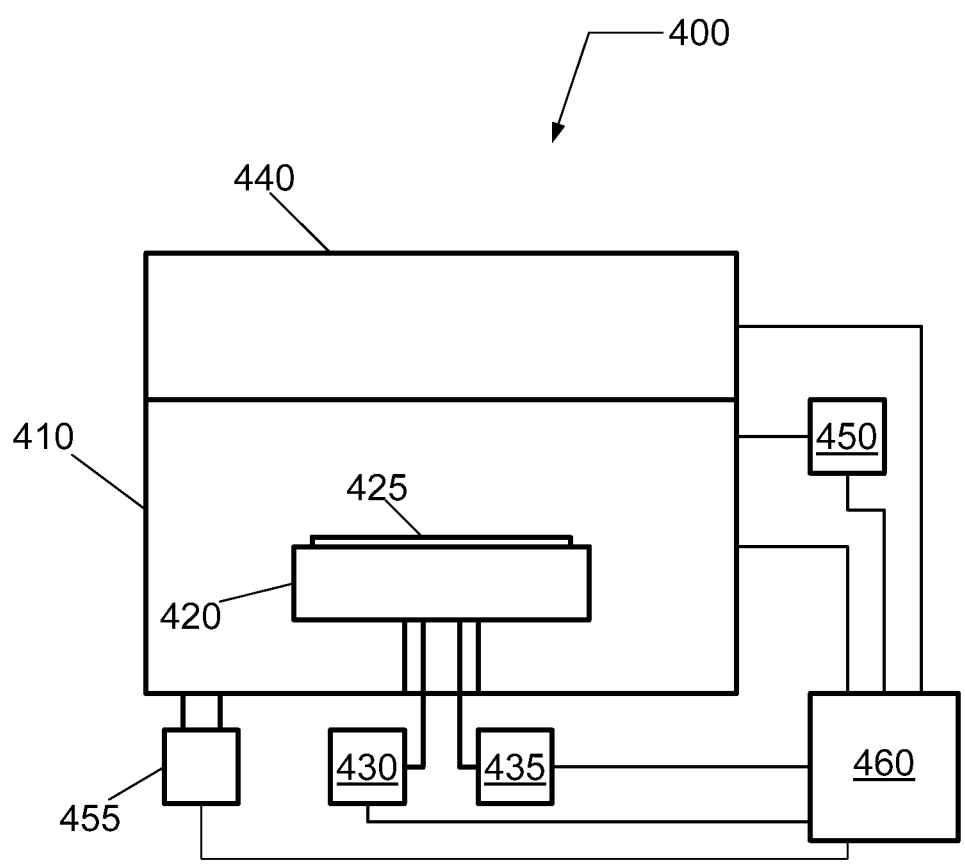
FIG. 6 is a schematic cross-sectional view of a curing system according to another embodiment.

Referring now to FIG. 6, a process module 400 configured to treat a dielectric film on a substrate is shown according to another embodiment. As an example, the process module 400 may be configured to cure a dielectric film. Process module 400 includes a process chamber 410 configured to produce a clean, contaminant-free environment for curing a substrate 425 resting on substrate holder 420. Process module 400 further includes a radiation source 440 configured to expose substrate 425 having the dielectric film to EM radiation.

The EM radiation is dedicated to a specific radiation waveband, and includes single, multiple, narrow-band, or broad-band EM wavelengths within that specific radiation waveband. For example, the radiation source 440 can include an IR radiation source configured to produce EM radiation in the IR spectrum. Alternatively, for example, the radiation source 440 can include a UV radiation source configured to produce EM radiation in the UV spectrum. In this embodiment, IR treatment and UV treatment of substrate 425 can be performed in a separate process modules.

The IR radiation source may include a broad-band IR source (e.g., polychromatic), or may include a narrow-band IR source (e.g., monochromatic). The IR radiation source may include one or more IR lamps, one or more IR LEDs, or one or more IR lasers (continuous wave (CW), tunable, or pulsed), or any combination thereof. The IR power density may range up to about 20 W/cm$^2$. For example, the IR power density may range from about 1 W/cm$^2$ to about 20 W/cm$^2$. The IR radiation wavelength may range from approximately 1 micron to approximately 25 microns. Alternatively, the IR radiation wavelength may range from approximately 8 microns to approximately 14 microns. Alternatively, the IR radiation wavelength may range from approximately 8 microns to approximately 12 microns. Alternatively, the IR radiation wavelength may range from approximately 9 microns to approximately 10 microns. For example, the IR radiation source may include a $CO_2$ laser system. Additional, for example, the IR radiation source may include an IR element, such as a ceramic element or silicon carbide element, having a spectral output ranging from approximately 1 micron to approximately 25 microns, or the IR radiation source can include a semiconductor laser (diode), or ion, Ti:sapphire, or dye laser with optical parametric amplification.

The UV radiation source may include a broad-band UV source (e.g., polychromatic), or may include a narrow-band UV source (e.g., monochromatic). The UV radiation source may include one or more UV lamps, one or more UV LEDs, or one or more UV lasers (continuous wave (CW), tunable, or pulsed), or any combination thereof. UV radiation may be generated, for instance, from a microwave source, an arc discharge, a dielectric barrier discharge, or electron impact generation. The UV power density may range from approximately 0.1 mW/cm$^2$ to approximately 2000 mW/cm$^2$. The UV wavelength may range from approximately 100 nanometers (nm) to approximately 600 nm. Alternatively, the UV radiation may range from approximately 150 nm to approximately 400 nm. Alternatively, the UV radiation may range from approximately 150 nm to approximately 300 nm. Alternatively, the UV radiation may range from approximately 170 nm to approximately 240 nm. Alternatively, the UV radiation may range from approximately 200 nm to approximately 240 nm. For example, the UV radiation source may include a direct current (DC) or pulsed lamp, such as a Deuterium ($D_2$) lamp, having a spectral output ranging from approximately 180 nm to approximately 500 nm, or the UV radiation source may include a semiconductor laser (diode), (nitrogen) gas laser, frequency-tripled (or quadrupled) Nd:YAG laser, or copper vapor laser.

The IR radiation source, or the UV radiation source, or both, may include any number of optical device to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

The substrate holder 420 can further include a temperature control system that can be configured to elevate and/or control the temperature of substrate 425. The temperature control system can be a part of a thermal treatment device 430. The substrate holder 420 can include one or more conductive heating elements embedded in substrate holder 420 coupled to a power source and a temperature controller. For example, each heating element can include a resistive heating element coupled to a power source configured to supply electrical power. The substrate holder 420 could optionally include one or more radiative heating elements. The temperature of substrate 425 can, for example, range from approximately 20 degrees C. to approximately 600 degrees C., and desirably, the temperature may range from approximately 100 degrees C. to approximately 600 degrees C. For example, the temperature of substrate 425 can range from approximately 300 degrees C. to approximately 500 degrees C., or from approximately 350 degrees C. to approximately 450 degrees C.

The substrate holder 420 can further include a drive system 435 configured to translate, or rotate, or both translate and rotate the substrate holder 420 to move the substrate 425 relative to radiation source 440.

Additionally, the substrate holder 420 may or may not be configured to clamp substrate 425. For instance, substrate holder 420 may be configured to mechanically or electrically clamp substrate 425.

Although not shown, substrate holder 420 may be configured to support a plurality of substrates.

Referring again to FIG. 6, process module 400 can further include a gas injection system 450 coupled to the process chamber 410 and configured to introduce a purge gas to process chamber 410. The purge gas can, for example, include an inert gas, such as a noble gas or nitrogen. Alternatively, the purge gas can include other gases, such as for example $O_2$, $H_2$, $NH_3$, $C_xH_y$, or any combination thereof. Additionally, process module 400 can further include a vacuum pumping system 455 coupled to process chamber 410 and configured to evacuate the process chamber 410. During a curing process, substrate 425 can be subject to a purge gas environment with or without vacuum conditions.

Furthermore, as shown in FIG. 6, process module 400 can include a controller 460 coupled to process chamber 410, substrate holder 420, thermal treatment device 430, drive system 435, radiation source 440, gas injection system 450, and vacuum pumping system 455. Controller 460 includes a microprocessor, a memory, and a digital I/O port capable of generating control voltages sufficient to communicate and activate inputs to the process module 400 as well as monitor outputs from the process module 400. A program stored in the memory is utilized to interact with the process module 400 according to a stored process recipe. The controller 460 can be used to configure any number of processing elements (410, 420, 430, 435, 440, 450, or 455), and the controller 460 can collect, provide, process, store, and display data from processing elements. The controller 460 can include a number of applications for controlling one or more of the processing elements. For example, controller 460 can include a graphic user interface (GUI) component (not shown) that can provide easy to use interfaces that enable a user to monitor and/or control one or more processing elements.

Figure 7:
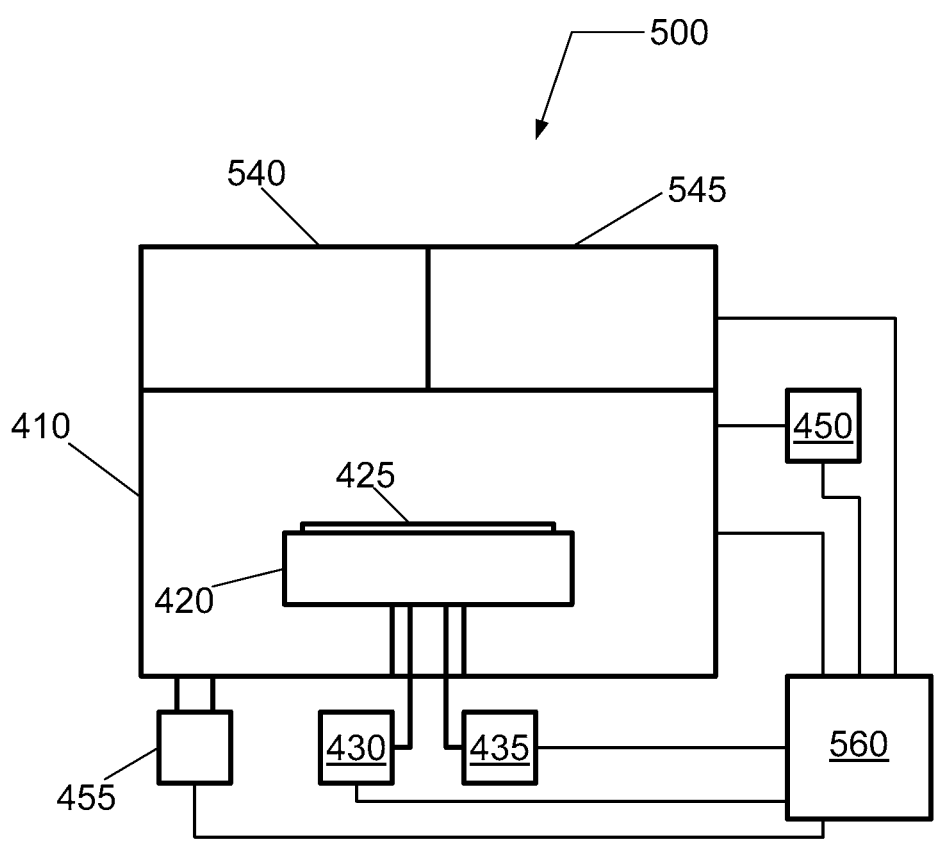
FIG. 7 is a schematic cross-sectional view of a curing system according to another embodiment.

Referring now to FIG. 7, a process module 500 configured to treat a dielectric film on a substrate is shown according to another embodiment. As an example, the process module 500 may be configured to cure a dielectric film. Process module 500 includes many of the same elements as those depicted in FIG. 6. The process module 500 comprises process chamber 410 configured to produce a clean, contaminant-free environment for curing a substrate 425 resting on substrate holder 420. Process module 500 includes a first radiation source 540 configured to expose substrate 425 having the dielectric film to a first radiation source grouping of EM radiation.

Process module 500 further includes a second radiation source 545 configured to expose substrate 425 having the dielectric film to a second radiation source grouping of EM radiation. Each grouping of EM radiation is dedicated to a specific radiation wave-band, and includes single, multiple, narrow-band, or broadband EM wavelengths within that specific radiation wave-band. For example, the first radiation source 540 can include an IR radiation source configured to produce EM radiation in the IR spectrum. Additionally, for example, the second radiation source 545 can include a UV radiation source configured to produce EM radiation in the UV spectrum. In this embodiment, IR treatment and UV treatment of substrate 425 can be performed in a single process module.

Furthermore, as shown in FIG. 7, process module 500 can include a controller 560 coupled to process chamber 410, substrate holder 420, thermal treatment device 430, drive system 435, first radiation source 540, second radiation source 545, gas injection system 450, and vacuum pumping system 455. Controller 560 includes a microprocessor, a memory, and a digital I/O port capable of generating control voltages sufficient to communicate and activate inputs to the process module 500 as well as monitor outputs from the process module 500. A program stored in the memory is utilized to interact with the process module 500 according to a stored process recipe. The controller 560 can be used to configure any number of processing elements (410, 420, 430, 435, 540, 545, 450, or 455), and the controller 560 can collect, provide, process, store, and display data from processing elements. The controller 460 can include a number of applications for controlling one or more of the processing elements. For example, controller 560 can include a graphic user interface (GUI) component (not shown) that can provide easy to use interfaces that enable a user to monitor and/or control one or more processing elements.

Figure 8A:
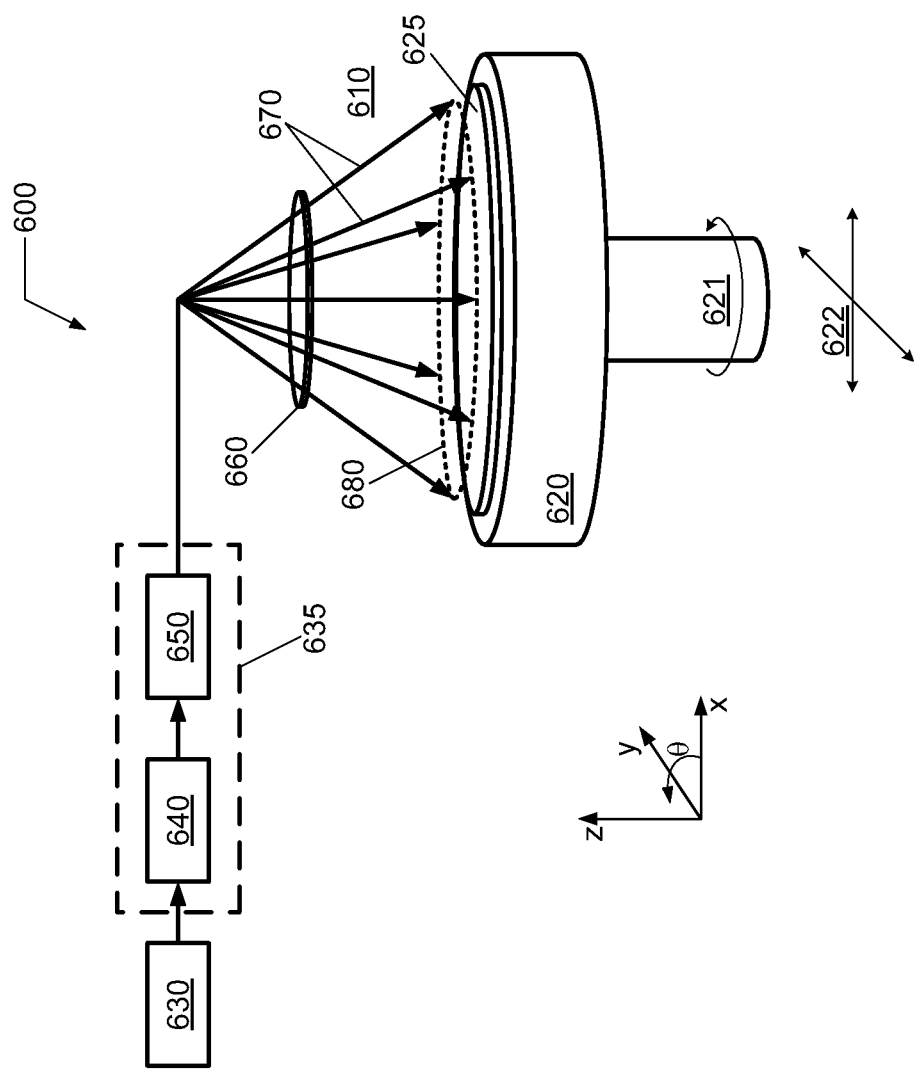
FIG. 8A provides a schematic illustration of an optical system for exposing a substrate to electromagnetic radiation according to an embodiment.

Referring now to FIG. 8A, a schematic illustration of an optical system 600 for exposing a substrate to EM radiation is presented according to an embodiment. The optical system 600 comprises a radiation source 630 and an optics assembly 635, which are coupled to a process module and configured to illuminate a substrate 625 disposed in the process module with EM radiation. As shown in FIG. 8A, the radiation source 630 is configured to produce a beam of EM radiation 670, and the optics assembly 635 is configured to manipulate the beam of EM radiation 670 in such a manner to partly or fully illuminate at least one region on substrate 625.

The radiation source 630 may comprise an IR radiation source, or a UV radiation source. Furthermore, the radiation source 630 may comprise a plurality of radiation sources. For example, the radiation source 630 may comprise one or more IR lasers, or one or more UV lasers.

The optics assembly 635 may comprise a beam sizing device 640 configured to size the beam of EM radiation 670. Furthermore, the optics assembly 635 may comprise a beam shaping device 650 configured to shape the beam of EM radiation 670. The beam sizing device 640, or the beam shaping device 650, or both may include any number of optical devices to adjust one or more properties of the beam of EM radiation 670. For example, each device may include optical filters, optical lenses, optical mirrors, beam expanders, beam collimators, etc. Such optical manipulation devices as known to those skilled in the art of optics and EM wave propagation are suitable for the invention.

As illustrated in FIG. 8A, optical system 600 is configured to size, or shape, or both size and shape the beam of EM radiation 670 for flood illumination of the entire upper surface of substrate 625. The beam of EM radiation 670 enters the process module through an optical window 660, and transmits through process space 610 to substrate 625. Although full illumination of substrate 625 is shown, the beam of EM radiation 670 may illuminate only a fraction of the upper surface of substrate 625.

As an example, the optical window 660 may be fabricated from sapphire, $CaF_2$, $BaF_2$, ZnSe, ZnS, Ge, or GaAs for IR transmission. Additionally, for example, the optical window 660 may be fabricated from $SiO_x$-containing materials, such as quartz, fused silica, glass, sapphire, $CaF_2$, $MgF_2$, etc. for UV transmission. Furthermore, for example, the optical window 660 may be fabricated from KCl for IR transmission and UV transmission. The optical window 660 may also be coated with an anti-reflective coating.

Substrate 625 rests on substrate holder 620 in the process module. The substrate holder 620 can further include a temperature control system that can be configured to elevate and/or control the temperature of substrate 625. The substrate holder 620 can include a drive system configured to vertically and/or laterally translate (lateral (x-y) translation indicated by label 622), or rotate (rotation indicated by label 621), or both translate and rotate the substrate holder 620 to move the substrate 625 relative to the beam of EM radiation 670. Additionally, the substrate holder 620 can include a motion control system coupled to the drive system, and configured to perform at least one of monitoring a position of substrate 625, adjusting the position of substrate 625, or controlling the position of substrate 625.

Furthermore, the substrate holder 620 may or may not be configured to clamp substrate 625. For instance, substrate holder 620 may be configured to mechanically or electrically clamp substrate 625.

Figure 8B:
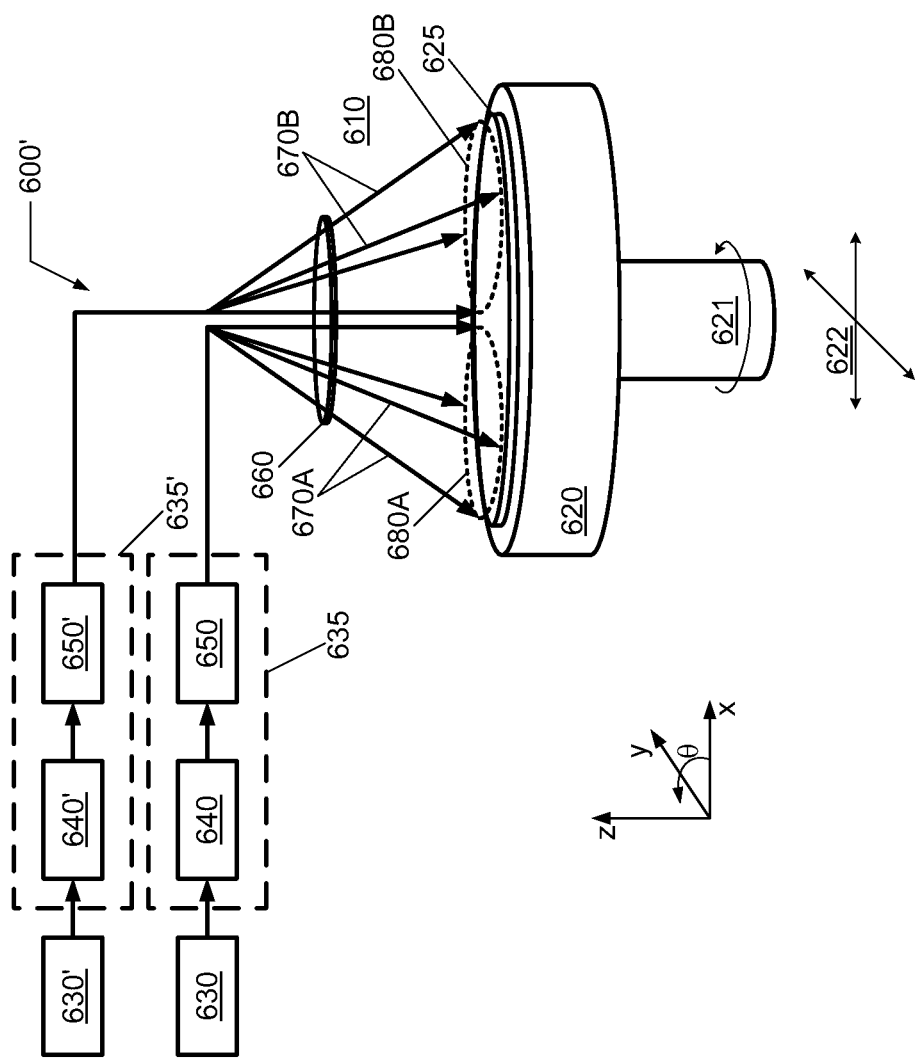
FIG. 8B provides a schematic illustration of an optical system for exposing a substrate to electromagnetic radiation according to another embodiment.

Referring now to FIG. 8B, a schematic illustration of an optical system 600' for exposing a substrate to EM radiation is presented according to another embodiment. The optical system 600' comprises radiation source 630 and optics assembly 635, which are coupled to a process module and configured to illuminate substrate 625 disposed in the process module with EM radiation as depicted in FIG. 8A. The optical system 600' further comprises a second radiation source 630' and a second optics assembly 635', which are coupled to the process module and configured to illuminate substrate 625 with second EM radiation.

As shown in FIG. 8B, the first radiation source 630 is configured to produce a first beam of EM radiation 670A and the first optics assembly 635 is configured to manipulate the first beam of EM radiation 670A in such a manner to illuminate a first region 680A on substrate 625, and the second radiation source 630' is configured to produce a second beam of EM radiation 670B and the second optics assembly 635' is configured to manipulate the second beam of EM radiation 670B in such a manner to illuminate a second region 680B on substrate 625.

The radiation source 630 may comprise an IR radiation source, or a UV radiation source. Furthermore, the radiation source 630 may comprise a plurality of radiation sources. For example, the radiation source 630 may comprise one or more IR lasers, or one or more UV lasers. The second radiation source 630' may comprise an IR radiation source, or a UV radiation source. Furthermore, the second radiation source 630' may comprise a plurality of radiation sources. For example, the second radiation source 630' may comprise one or more IR lasers, or one or more UV lasers.

As shown in FIG. 8B, the second optics assembly 635' may comprise a beam sizing device 640' configured to size the second beam of EM radiation 670B. The second optics 635' may comprise a beam shaping device 650' configured to shape the second beam of EM radiation 670B.

As illustrated in FIG. 8B, optical system 600' is configured to size, or shape, or both size and shape the first beam of EM radiation 670A and the second beam of EM radiation 670B for illumination of the upper surface of substrate 625. The first beam of EM radiation 670A enters the process module through optical window 660, and transmits through process space 610 to the first region 680A of substrate 625. The second beam of EM radiation 670B enters the process module through optical window 660, and transmits through process space 610 to the second region 680B of substrate 625. Full illumination of substrate 625 by the first and second beams of EM radiation 670A, 670B is shown; however, the first and second beams of EM radiation 670A, 670B may illuminate only a fraction of the upper surface of substrate 625. Furthermore, the first region 680A and second region 680B are shown as distinct regions without overlap; however, the first region 680A and the second region 680B may overlap.

Although only one optical window 660 is shown, a plurality of optical windows may be used through which the first and second beams of EM radiation 670A, 670B may be transmitted. Furthermore, the optical system 600' may be configured to illuminate substrate 625 with more than two beams of EM radiation.

Figure 9:
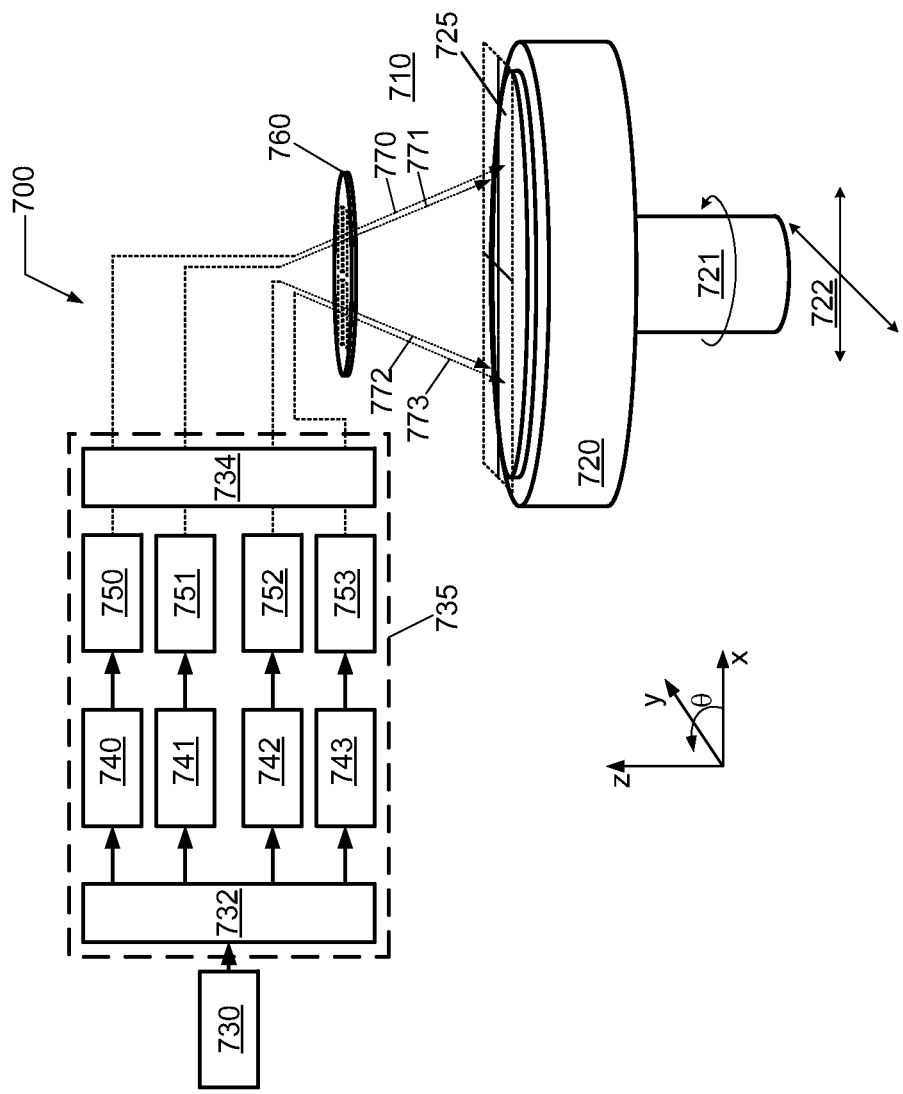
FIG. 9 provides a schematic illustration of an optical system for exposing a substrate to electromagnetic radiation according to another embodiment.

Referring now to FIG. 9, a schematic illustration of an optical system 700 for exposing a substrate to EM radiation is presented according to another embodiment. The optical system 700 comprises a radiation source 730 and optics assembly 735, which are coupled to a process module and configured to illuminate substrate 725 disposed in the process module with EM radiation. As shown in FIG. 9, the optical system 700 is configured to produce a plurality of beams of EM radiation 770, 771, 772, 773, and manipulate each beam of EM radiation 770, 771, 772, 773 in such a manner to illuminate different regions on substrate 725.

The radiation source 730 can produce one or more beams of EM radiation. For example, the radiation source 730 may comprise an IR radiation source, or a UV radiation source. Additionally, for example, the radiation source 730 may comprise one or more IR lasers, or one or more UV lasers. As shown in FIG. 9, the optical system 700 can comprise one or more beam splitting devices 732 configured to split at least one of the one or more sources of EM radiation output from radiation source 730 to generate the plurality of beams of EM radiation 770, 771, 772, 773. Additionally, the optical system 700 can comprise one or more beam combining devices 734 configured to combine the plurality of beams of EM radiation 770, 771, 772, 773 onto at least a portion of substrate 725. For example, the one or more beam splitting devices 732 and the one or more beam combining devices 734 may include optical lenses, optical mirrors, beam apertures, etc. Such optical manipulation devices as known to those skilled in the art of optics and EM wave propagation are suitable for the invention.

Additionally, the optical system 700 comprises a plurality of beam sizing devices 740, 741, 742, 743, wherein each of the plurality of beam sizing devices 740, 741, 742, 743 is configured to size one of the plurality of beams of EM radiation. Furthermore, the optical system 700 comprises a plurality of beam shaping devices 750, 751, 752, 753, wherein each of the plurality of beam shaping devices 750, 751, 752, 753 is configured to shape one of the plurality of beams of EM radiation. The beam sizing devices 740, 741, 742, 743, or the beam shaping devices 750, 751, 752, 753, or both may include any number of optical devices to adjust one or more properties of the output radiation. For example, each device may include optical filters, optical lenses, optical mirrors, beam expanders, beam collimators, etc. Such optical manipulation devices as known to those skilled in the art of optics and EM wave propagation are suitable for the invention.

Figure 10A:
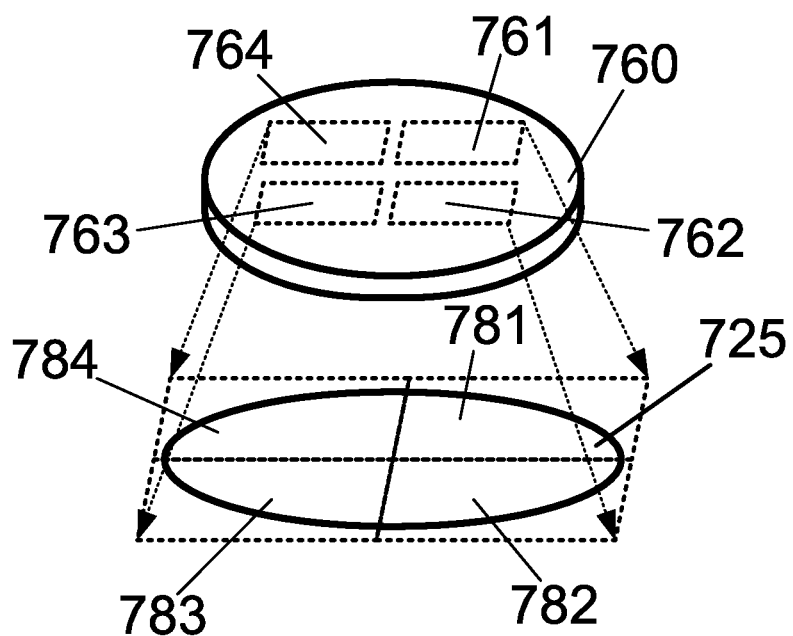
FIGS. 10A and 10B provide illustrations of an optical window assembly for use in the optical system depicted in FIG. 9.

As illustrated in FIGS. 9 and 10A, the one or more beam combining devices 734 is configured to illuminate substrate 725 at a plurality of locations 781, 782, 783, 784 with the plurality of beams of EM radiation 770, 771, 772, 773, wherein the plurality of locations 781, 782, 783, 784 substantially abut one another and illuminate approximately the entire upper surface of substrate 725. The size and/or shape of the plurality of beams of EM radiation 770, 771, 772, 773 may be adjusted using the plurality of beam sizing devices 740, 741, 742, 743, and the plurality of beam shaping devices 750, 751, 752, 753.

Alternatively, the one or more beam combining devices 734 is configured to illuminate substrate 725 at substantially the same location with the plurality of beams of EM radiation 770, 771, 772, 773. Alternatively yet, the one or more beam combining devices 734 is configured to illuminate substrate 725 at a plurality of locations with the plurality of beams of EM radiation 770, 771, 772, 773, wherein at least two of the plurality of locations overlap one another.

Figure 10B:
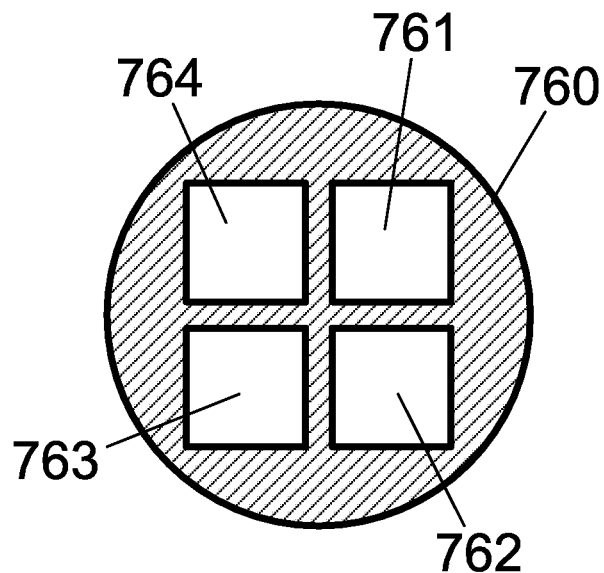

As illustrated in FIGS. 10A and 10B, optical system 700 is configured to size, or shape, or both size and shape each beam of EM radiation 770, 771, 772, 773 for illumination of the upper surface of substrate 725. Each beam of EM radiation 770, 771, 772, 773 enters the process module through optical windows 761, 762, 763, 764, respectively, in optical window assembly 760, and transmits through process space 710 to substrate regions 781, 782, 783, 784 of substrate 725. Full illumination of substrate 725 by the plurality of beams of EM radiation 770, 771, 772, 773 is shown; however, the plurality of beams of EM radiation 770, 771, 772, 773 may illuminate only a fraction of the upper surface of substrate 725. Furthermore, the substrate regions 781, 782, 783, 784 are shown as distinct regions without overlap; however, the substrate regions 781, 782, 783, 784 may overlap.

Although each beam of EM radiation 770, 771, 772, 773 is shown to transmit through a separate optical window 761, 762, 763, 764, respectively, a single optical window may be used through which the plurality of beams of EM radiation 770, 771, 772, 773 may pass. Alternatively, one or more optical windows may be used to transmit the plurality of beams of EM radiation 770, 771, 772, 773.

Substrate 725 rests on substrate holder 720 in the process module. The substrate holder 720 can further include a temperature control system that can be configured to elevate and/or control the temperature of substrate 725. The substrate holder 720 can include a drive system configured to vertically and/or laterally translate (lateral (x-y) translation indicated by label 722), or rotate (rotation indicated by label 721), or both translate and rotate the substrate holder 720 to move the substrate 725 relative to the plurality of beams of EM radiation 770, 771, 772, 773. Additionally, the substrate holder 720 can include a motion control system coupled to the drive system, and configured to perform at least one of monitoring a position of substrate 725, adjusting the position of substrate 725, or controlling the position of substrate 725.

Furthermore, the substrate holder 720 may or may not be configured to clamp substrate 725. For instance, substrate holder 720 may be configured to mechanically or electrically clamp substrate 725.

Figure 11:
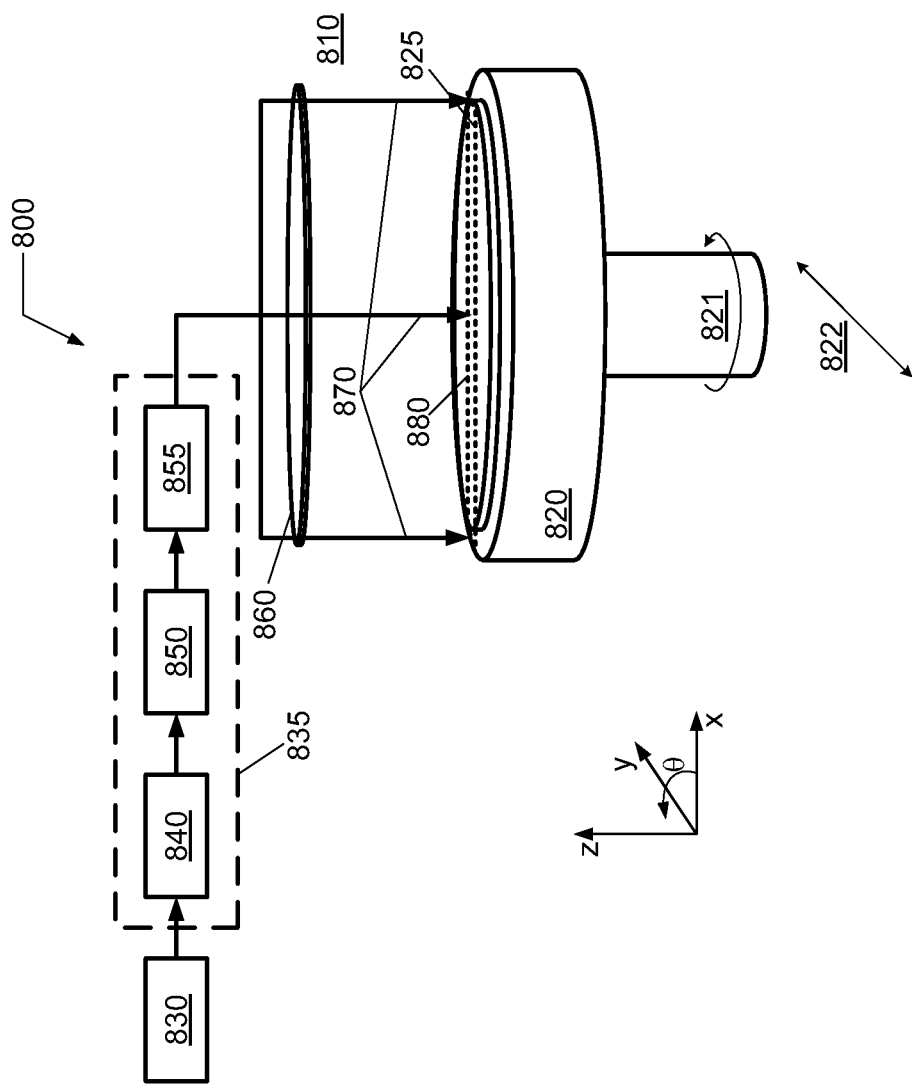
FIG. 11 provides a schematic illustration of an optical system for exposing a substrate to electromagnetic radiation according to another embodiment.

Referring now to FIG. 11, a schematic illustration of an optical system 800 for exposing a substrate to EM radiation is presented according to another embodiment. The optical system 800 comprises a radiation source 830 and optics assembly 835, which are coupled to a process module and configured to illuminate substrate 825 disposed in the process module with EM radiation. As shown in FIG. 11, the optical system 800 is configured to produce a sheet of EM radiation 870, and manipulate the sheet of EM radiation 870 in such a manner to illuminate a region 880 on substrate 825. A sheet of radiation may include a slit of EM radiation, or a bar beam of EM radiation.

The radiation source 830 may comprise an IR radiation source, or a UV radiation source. Furthermore, the radiation source 830 may comprise a plurality of radiation sources. For example, the radiation source 830 may comprise one or more IR lasers, or one or more UV lasers.

The optics assembly 835 may comprise a sheet sizing device 840 configured to size the sheet of EM radiation 870. Additionally, the optics assembly 835 may comprise a sheet shaping device 850 configured to shape the sheet of EM radiation 870. Furthermore, the optics assembly 835 may comprise a sheet filtering device 855 configured to filter the sheet of EM radiation 870. The sheet sizing device 840, the sheet shaping device 850, or the sheet filtering device 855, or any combination of two or more thereof may include any number of optical devices to adjust one or more properties of the sheet of EM radiation 870. For example, each device may include optical filters, optical lenses, optical mirrors, beam expanders, beam collimators, etc. Such optical manipulation devices as known to those skilled in the art of optics and EM wave propagation are suitable for the invention.

As illustrated in FIG. 11, optical system 800 is configured to size, shape, or filter, or both size and shape the sheet of EM radiation 870 for illumination of a fraction of the upper surface of substrate 825. The sheet of EM radiation 870 enters the process module through an optical window 860, and transmits through process space 810 to substrate 825. Although the sheet of EM radiation 870 is shown to span the diameter of substrate 825, the sheet of EM radiation 870 may illuminate only a fraction of the diameter or lateral dimension of substrate 825.

Substrate 825 rests on substrate holder 820 in the process module. The sheet of EM radiation 870 may be translated or rotated relative to the substrate 828. Alternatively, the substrate holder 820 may be translated or rotated relative to the sheet of EM radiation 870.

The substrate holder 820 can include a drive system configured to vertically and/or laterally translate (lateral (x-y) translation indicated by label 822), or rotate (rotation indicated by label 821), or both translate and rotate the substrate holder 820 to move the substrate 825 relative to the sheet of EM radiation 870. Additionally, the substrate holder 820 can include a motion control system coupled to the drive system, and configured to perform at least one of monitoring a position of substrate 825, adjusting the position of substrate 825, or controlling the position of substrate 825.

The substrate holder 820 can further include a temperature control system that can be configured to elevate and/or control the temperature of substrate 825. Furthermore, the substrate holder 820 may or may not be configured to clamp substrate 825. For instance, substrate holder 820 may be configured to mechanically or electrically clamp substrate 825.

Figure 12:
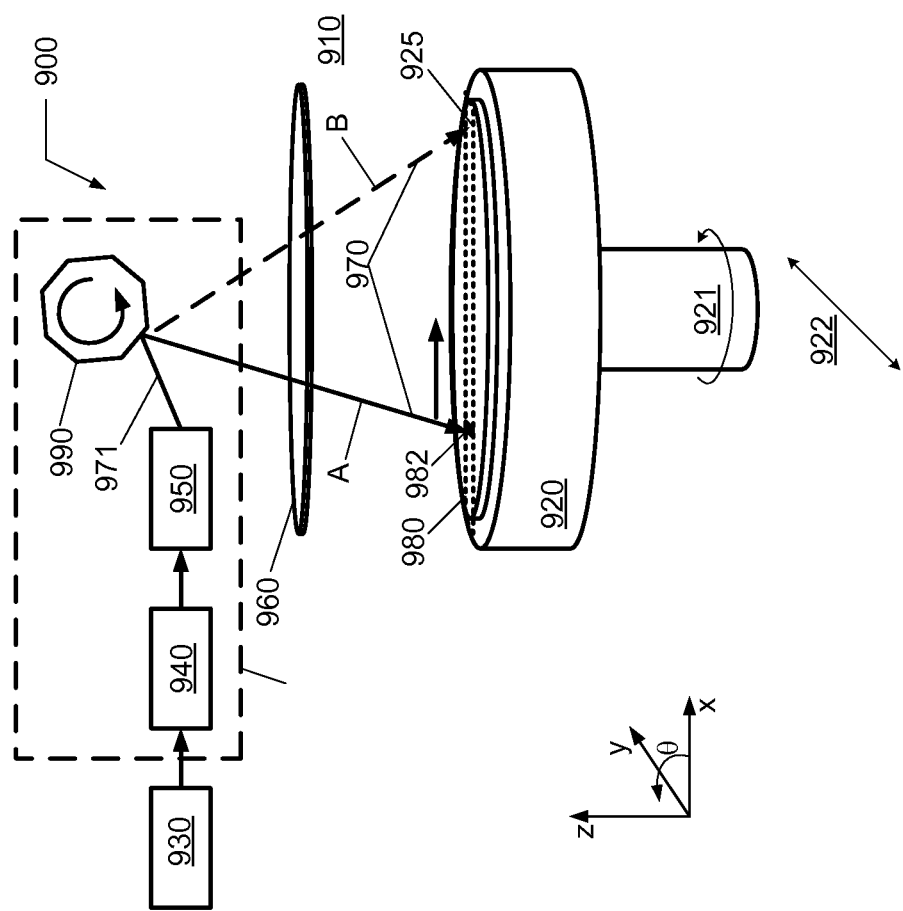
FIG. 12 provides a schematic illustration of an optical system for exposing a substrate to electromagnetic radiation according to another embodiment.

Referring now to FIG. 12, a schematic illustration of an optical system 900 for exposing a substrate to EM radiation is presented according to another embodiment. The optical system 900 comprises a radiation source 930 and optics assembly 935, which are coupled to a process module and configured to illuminate substrate 925 disposed in the process module with EM radiation. As shown in FIG. 12, the optical system 900 is configured to produce a raster scan a beam of EM radiation 971 to produce a sheet of EM radiation 970, and manipulate the beam of EM radiation 971 in such a manner to illuminate a region 980 on substrate 925.

The radiation source 930 may comprise an IR radiation source, or a UV radiation source. Furthermore, the radiation source 930 may comprise a plurality of radiation sources. For example, the radiation source 930 may comprise one or more IR lasers, or one or more UV lasers.

The optics assembly 935 may comprise a raster scanning device 955 configured to scan the beam of EM radiation 971 to produce the sheet of EM radiation 970. The raster scanning device 955 may comprise a rotating, multi-faceted mirror that scans the beam of EM radiation 971 across substrate 925 from location A to location B to form the sheet of EM radiation 970. Alternatively, the raster scanning device 955 may comprise a rotating, translucent disk that scans, via internal reflections within the rotating, translucent disk, the beam of EM radiation 971 across substrate 925 to form the sheet of EM radiation 970.

Furthermore, the optics assembly 935 may comprise a beam sizing device 940 configured to size the beam of EM radiation 971. Additionally, the optics assembly 935 may comprise a beam shaping device 950 configured to shape the beam of EM radiation 971. The beam sizing device 940, or the beam shaping device 950, or both may include any number of optical devices to adjust one or more properties of the sheet of EM radiation 970. For example, each device may include optical filters, optical lenses, optical mirrors, beam expanders, beam collimators, etc. Such optical manipulation devices as known to those skilled in the art of optics and EM wave propagation are suitable for the invention.

As illustrated in FIG. 12, the sheet of EM radiation 970 enters the process module through an optical window 960, and transmits through process space 910 to substrate 925. Although the sheet of EM radiation 970 is shown to span the diameter of substrate 925, the sheet of EM radiation 970 may illuminate only a fraction of the diameter or lateral dimension of substrate 925.

Figure 13:
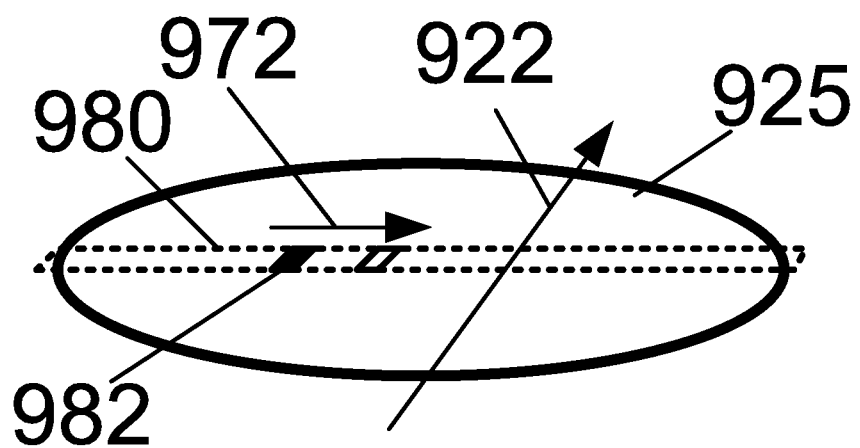
FIG. 13 illustrates a scanning technique for the optical system depicted in FIG. 12.

Substrate 925 rests on substrate holder 920 in the process module. The sheet of EM radiation 970 may be translated or rotated relative to the substrate 925. Alternatively, the substrate holder 920 may be translated or rotated relative to the sheet of EM radiation 970. As an example, FIG. 13 illustrates a method of raster scanning substrate 925. The beam of EM radiation 971 is scanned in a first lateral direction 972 along substrate region 980, wherein for an instant in time the beam of EM radiation 971 illuminates pattern 982 on substrate 925. While the beam of EM radiation 971 is scanned, the substrate holder may translate substrate 925 in a second lateral direction 922 that may substantially perpendicular to the first lateral direction.

The substrate holder 920 can include a drive system configured to vertically and/or laterally translate (lateral (x-y) translation indicated by label 922), or rotate (rotation indicated by label 921), or both translate and rotate the substrate holder 920 to move the substrate 925 relative to the sheet of EM radiation 970. Additionally, the substrate holder 920 can include a motion control system coupled to the drive system, and configured to perform at least one of monitoring a position of substrate 925, adjusting the position of substrate 925, or controlling the position of substrate 925.

The substrate holder 920 can further include a temperature control system that can be configured to elevate and/or control the temperature of substrate 925. Furthermore, the substrate holder 920 may or may not be configured to clamp substrate 925. For instance, substrate holder 920 may be configured to mechanically or electrically clamp substrate 925.

Figure 14:
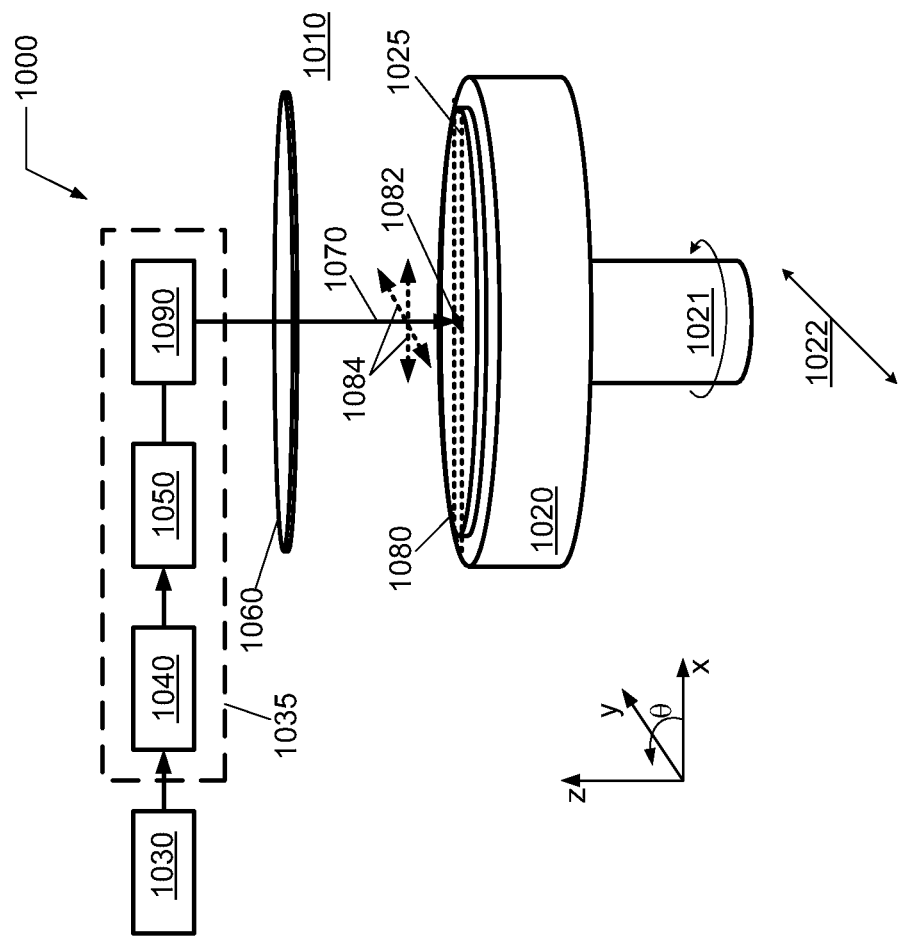
FIG. 14 provides a schematic illustration of an optical system for exposing a substrate to electromagnetic radiation according to another embodiment.

Referring now to FIG. 14, a schematic illustration of an optical system 1000 for exposing a substrate to EM radiation is presented according to yet another embodiment. The optical system 1000 comprises a radiation source 1030 and optics assembly 1035, which are coupled to a process module and configured to illuminate substrate 1025 disposed in the process module with EM radiation. As shown in FIG. 14, the optical system 1000 is configured to scan a beam of EM radiation 1070, and manipulate the beam of EM radiation 1070 in such a manner to illuminate a region 1080 on substrate 1025.

The radiation source 1030 may comprise an IR radiation source, or a UV radiation source. Furthermore, the radiation source 1030 may comprise a plurality of radiation sources. For example, the radiation source 1030 may comprise one or more IR lasers, or one or more UV lasers.

The optics assembly 1035 may comprise a radiation scanning device 1090 configured to scan the beam of EM radiation 1070. The radiation scanning device 1090 may comprise one or more mirror galvanometers to scan the beam of EM radiation 1070 in lateral directions 1084. For example, the one or more mirror galvanometers may comprise a 6200 Series High Speed Galvanometer commercially available from Cambridge Technology, Inc. Additionally, the optics assembly 1035 may comprise a scanning motion control system coupled to the radiation scanning device 1090, and configured to perform at least one of monitoring a position of the beam of EM radiation 1070, adjusting the position of the beam of EM radiation 1070, or controlling the position of the beam of EM radiation 1070.

Furthermore, the optics assembly 1035 may comprise a beam sizing device 1040 configured to size the beam of EM radiation 1070. Additionally, the optics assembly 1035 may comprise a beam shaping device 1050 configured to shape the beam of EM radiation 1070. The beam sizing device 1040, or the beam shaping device 1050, or both may include any number of optical devices to adjust one or more properties of the beam of EM radiation 1070. For example, each device may include optical filters, optical lenses, optical mirrors, beam expanders, beam collimators, etc. Such optical manipulation devices as known to those skilled in the art of optics and EM wave propagation are suitable for the invention.

As illustrated in FIG. 14, the beam of EM radiation 1070 enters the process module through an optical window 1060, and transmits through process space 1010 to substrate 1025. As illustrated in FIG. 14, for each instant in time, the beam of EM radiation 1070 illuminates a pattern 1082 on region 1080 of substrate 1025.

Substrate 1025 rests on substrate holder 1020 in the process module. The beam of EM radiation 1070 is scanned relative to the substrate 1025. Additionally, the substrate holder 1020 may be translated or rotated relative to the beam of EM radiation 1070. The substrate holder 1020 can include a drive system configured to vertically and/or laterally translate (lateral (x-y) translation indicated by label 1022), or rotate (rotation indicated by label 1021), or both translate and rotate the substrate holder 1020 to move the substrate 1025 relative to the beam of EM radiation 1070. Additionally, the substrate holder 1020 can include a motion control system coupled to the drive system, and configured to perform at least one of monitoring a position of substrate 1025, adjusting the position of substrate 1025, or controlling the position of substrate 1025.

The substrate holder 1020 can further include a temperature control system that can be configured to elevate and/or control the temperature of substrate 1025. Furthermore, the substrate holder 1020 may or may not be configured to clamp substrate 1025. For instance, substrate holder 1020 may be configured to mechanically or electrically clamp substrate 1025.

Figure 15A:
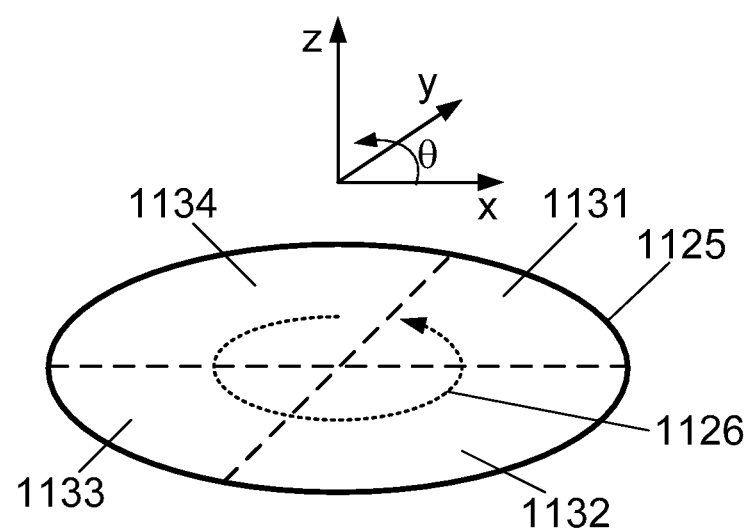
FIGS. 15A and 15B illustrate an optical pattern for exposing a substrate to EM radiation from two different regions in the electromagnetic spectrum according to an embodiment.

Referring now to FIG. 15A, a schematic illustration of a method for exposing a substrate to EM radiation is presented according to yet another embodiment. At a given instant in time, four regions 1131, 1132, 1133, 1134 of substrate 1125 are exposed to four sources of EM radiation. As an example, regions 1131 and 1133 may be exposed to IR radiation, while regions 1132 and 1134 are exposed to UV radiation. When substrate 1125 is rotated in azimuthal direction 1126, a given spot on the upper surface of substrate 1125 is exposed to an alternating sequence of IR and UV radiation.

Figure 15B:
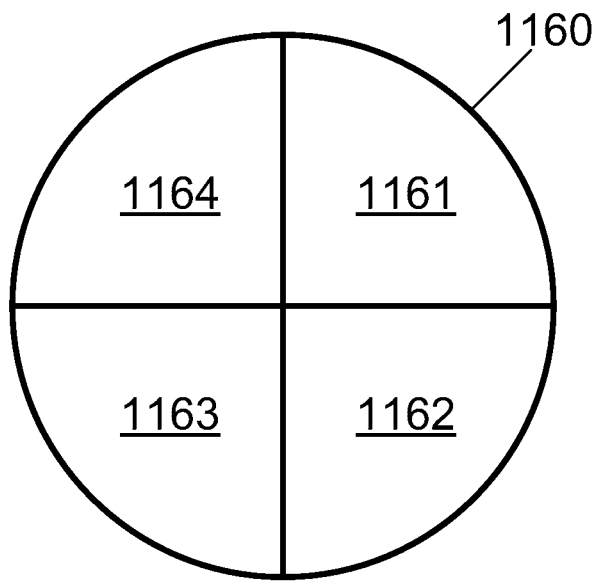

As shown in FIG. 15B, an optical window assembly 1160 may comprise an array of optical windows 1161, 1162, 1163, 1164, wherein the composition of each optical window is tailored for the spectrum of EM radiation to be transmitted there through. As an example, the composition of optical windows 1161 and 1163 may be tailored for IR transmission, and the composition of optical windows 1162 and 1164 may be tailored for UV transmission. For example, sapphire, $CaF_2$, $BaF_2$, ZnSe, ZnS, Ge, or GaAs may be optimal for IR transmission. Additionally, for example, $SiO_x$-containing materials, such as quartz, fused silica, glass, $CaF_2$, $MgF_2$, etc., may be optimal for UV transmission. Furthermore, for example, KCl may be optimal for IR transmission and UV transmission. The optical windows 1161, 1162, 1163, 1164 may also be coated with an anti-reflective coating.

Figure 16A:
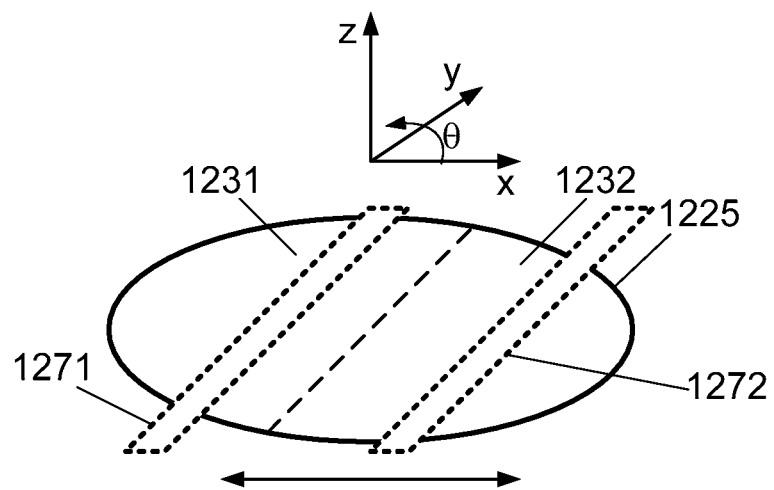
FIGS. 16A and 16B illustrate an optical pattern for exposing a substrate to EM radiation from two different spectral regions in the electromagnetic spectrum according to another embodiment.

Referring now to FIG. 16A, a schematic illustration of a method for exposing a substrate to EM radiation is presented according to yet another embodiment. At a given instant in time, two regions 1231, 1232 of substrate 1225 are exposed to two sources of EM radiation 1271, 1272. As an example, region 1231 may be exposed to IR radiation, while region 1232 may be exposed to UV radiation. When substrate 1225 is translated in lateral direction 1226, the upper surface of substrate 1225 is exposed to both IR and UV radiation. Substrate 1225 may also be rotated.

Figure 16B:
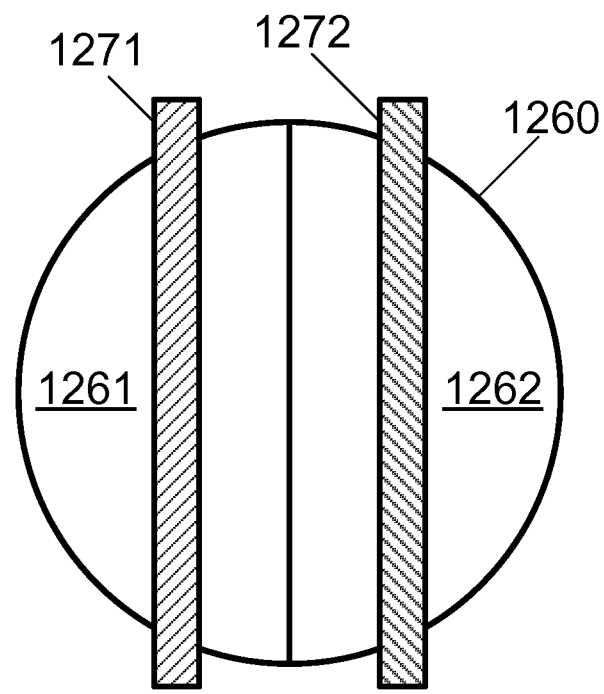

As shown in FIG. 16B, an optical window assembly 1260 may comprise an array of optical windows 1261, 1262, wherein the composition of each optical window is tailored for the spectrum of EM radiation to be transmitted there through. As an example, the composition of optical window 1261 may be tailored for IR transmission, and the composition of optical window 1262 may be tailored for UV transmission. For example, sapphire, $CaF_2$, $BaF_2$, ZnSe, ZnS, Ge, or GaAs may be optimal for IR transmission. Additionally, for example, $SiO_x$-containing materials, such as quartz, fused silica, glass, $CaF_2$, $MgF_2$, etc., may be optimal for UV transmission. Furthermore, for example, KCl may be optimal for IR transmission and UV transmission. The optical windows 1261, 1262 may also be coated with an anti-reflective coating.

Figure 17:
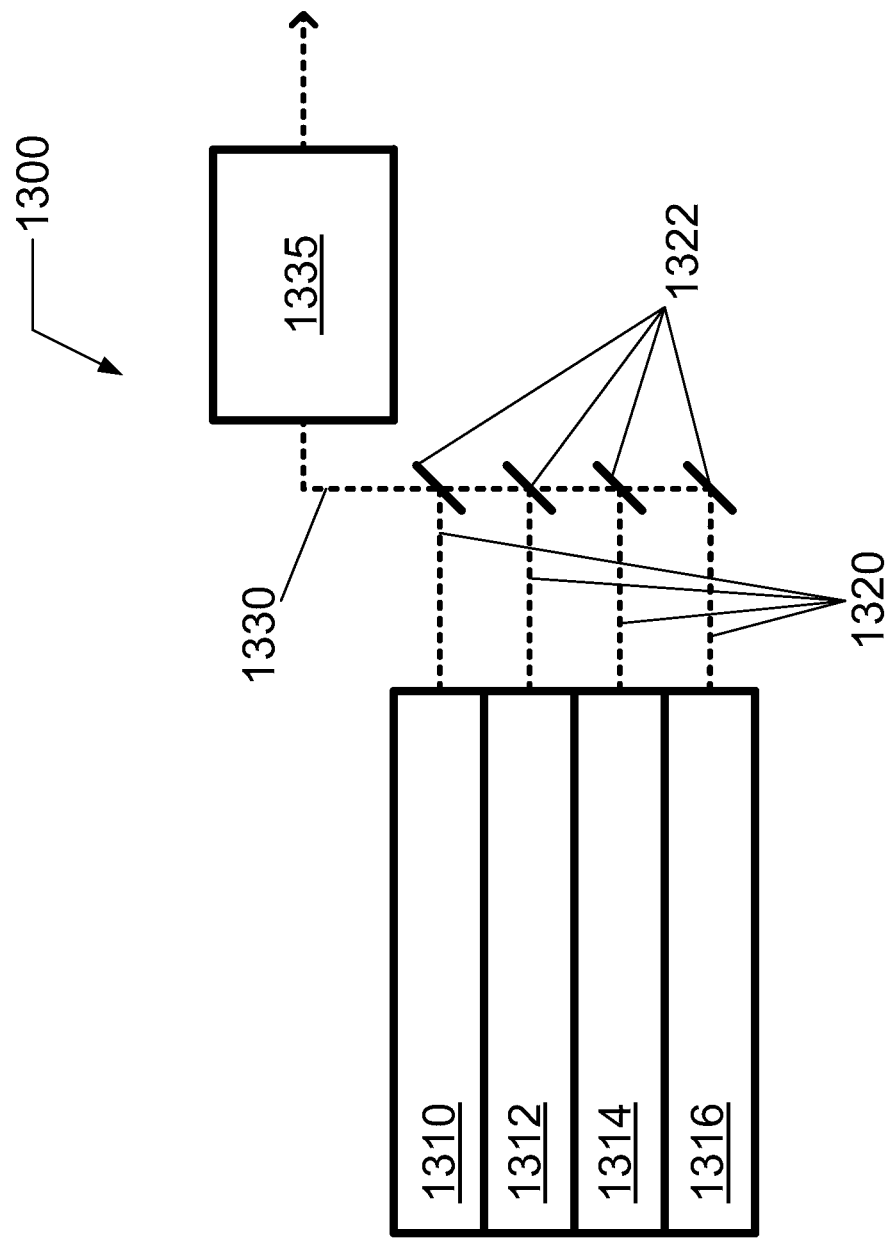
FIG. 17 provides a schematic illustration of an optical system for exposing a substrate to electromagnetic radiation according to yet another embodiment.

Referring now to FIG. 17, a schematic illustration of an optical system 1300 for exposing a substrate to EM radiation is presented according to yet another embodiment. The optical system 1300 comprises a plurality of radiation sources 1310, 1312, 1314, 1316 and an optics assembly 1335, which are coupled to a process module and configured to illuminate a substrate disposed in the process module with EM radiation.

Each radiation source 1310, 1312, 1314, 1316 can comprise a IR radiation source, or a UV radiation source. For example, radiation source 1310, 1312, 1314, 1316 may comprise an IR laser, or a UV laser.

As shown in FIG. 17, the optical system 1300 comprises an array of dual beam combiners 1322 configured to receive a plurality of beams of EM radiation 1320 from a plurality of radiation sources 1310, 1312, 1314, 1316, and combine two or more of the plurality of beams 1320 into a collective beam 1330. The dual beam combiners 1322 may include a polarizing beam splitter utilized in reverse.

As an example, the optical system 1300 may be configured to receive the plurality of beams of EM radiation 1320 from the plurality of radiation sources 1310, 1312, 1314, 1316, combine all of the plurality of beams of EM radiation 1320 into the collective beam 1330, and illuminate at least a portion of the substrate in the process module with the collective beam 1330. The collective beam 1330 may be sized and/or shaped using optics assembly, and may be directed to at least a portion of the substrate in the process chamber.

Figure 18A:
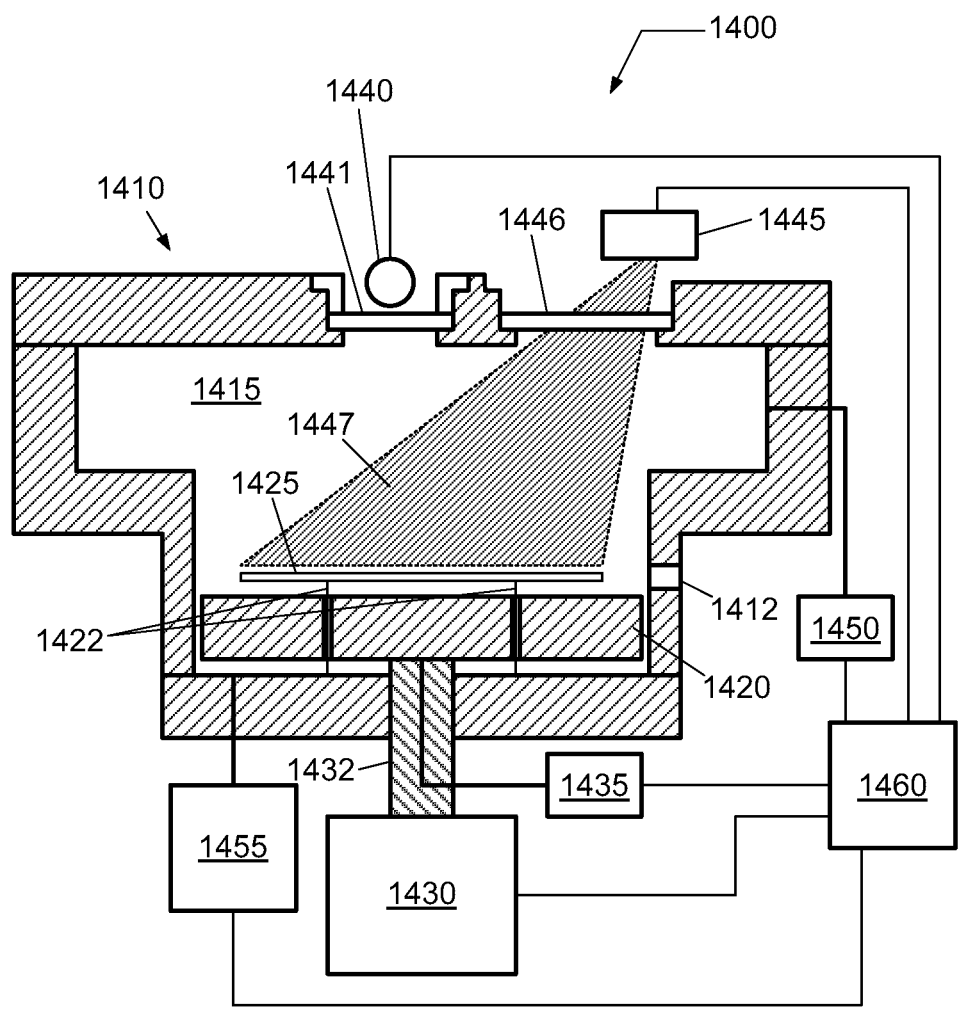
FIGS. 18A and 18B provide a cross-sectional view of a curing system for exposing a substrate to electromagnetic radiation from two different spectral regions in the electromagnetic spectrum according to another embodiment.
Figure 18B:
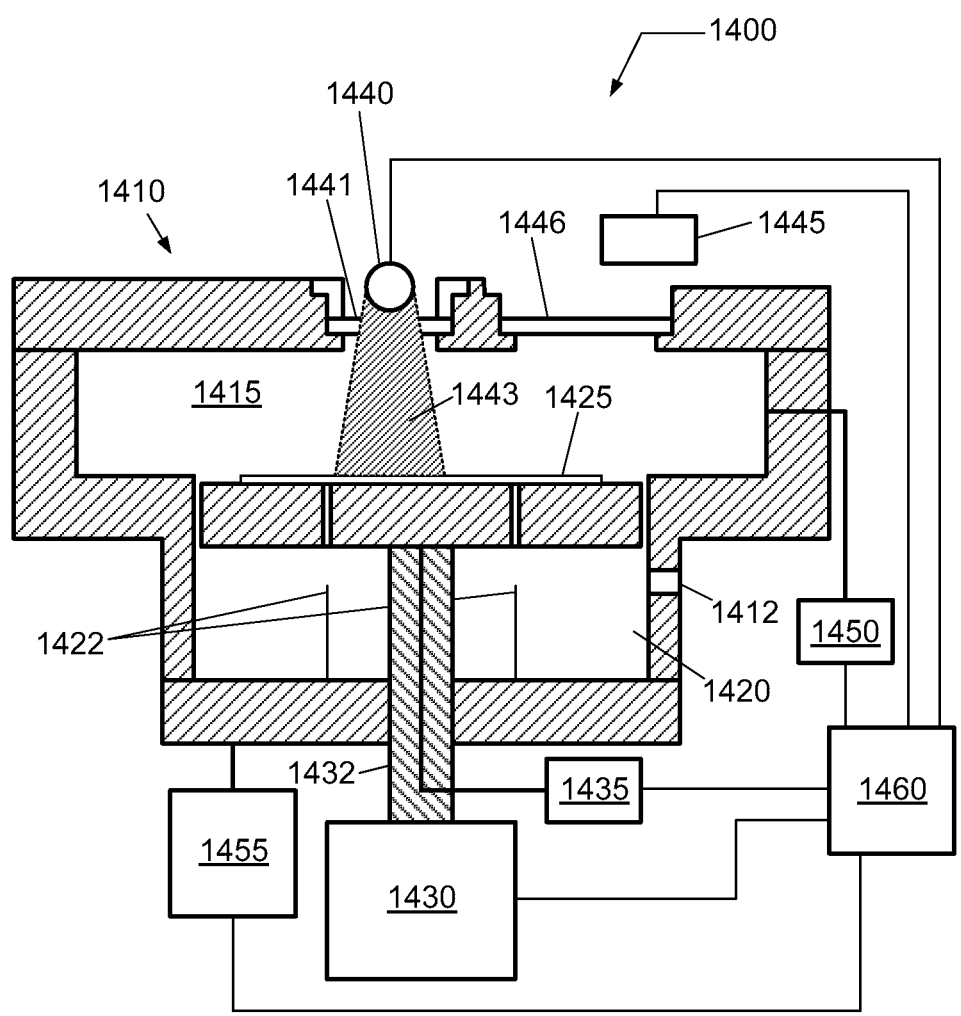

Referring now to FIGS. 18A and 18B, a process module 1400 configured to treat a dielectric film on a substrate is shown according to yet another embodiment. As an example, the process module 1400 may be configured to cure a dielectric film. The process module 1400 comprises process chamber 410 configured to produce a clean, contaminant-free environment for curing a substrate 1425 resting on substrate holder 1420. Process module 1400 includes a first radiation source 1440 configured to expose substrate 1425 having the dielectric film to a first radiation source grouping of EM radiation.

Process module 1400 further includes a second radiation source 1445 configured to expose substrate 1425 having the dielectric film to a second radiation source grouping of EM radiation. Each grouping of EM radiation is dedicated to a specific radiation wave-band, and includes single, multiple, narrow-band, or broadband EM wavelengths within that specific radiation wave-band. For example, the first radiation source 1440 can include a UV radiation source configured to produce EM radiation in the UV spectrum. Additionally, for example, the second radiation source 1445 can include an IR radiation source configured to produce EM radiation in the IR spectrum. In this embodiment, IR treatment and UV treatment of substrate 1425 can be performed in a single process module.

The IR radiation source may include a broad-band IR source (e.g., polychromatic), or may include a narrow-band IR source (e.g., monochromatic). The IR radiation source may include one or more IR lamps, one or more IR LEDs, or one or more IR lasers (continuous wave (CW), tunable, or pulsed), or any combination thereof. For example, the IR radiation source may include one or more IR lasers used in conjunction with any one of the optical systems described in FIGS. 8A, 8B, 9, 11, 12, 14, and 17.

The IR power density may range up to about 20 $W/cm^2$. For example, the IR power density may range from about 1 $W/cm^2$ to about 20 $W/cm^2$. The IR radiation wavelength may range from approximately 1 micron to approximately 25 microns. Alternatively, the IR radiation wavelength may range from approximately 8 microns to approximately 14 microns. Alternatively, the IR radiation wavelength may range from approximately 8 microns to approximately 12 microns. Alternatively, the IR radiation wavelength may range from approximately 9 microns to approximately 10 microns. For example, the IR radiation source may include a $CO_2$ laser system. Additional, for example, the IR radiation source may include an IR element, such as a ceramic element or silicon carbide element, having a spectral output ranging from approximately 1 micron to approximately 25 microns, or the IR radiation source can include a semiconductor laser (diode), or ion, Ti:sapphire, or dye laser with optical parametric amplification.

The UV radiation source may include a broad-band UV source (e.g., polychromatic), or may include a narrow-band UV source (e.g., monochromatic). The UV radiation source may include one or more UV lamps, one or more UV LEDs, or one or more UV lasers (continuous wave (CW), tunable, or pulsed), or any combination thereof. For example, the UV radiation source may include one or more UV lamps.

UV radiation may be generated, for instance, from a microwave source, an arc discharge, a dielectric barrier discharge, or electron impact generation. The UV power density may range from approximately 0.1 $mW/cm^2$ to approximately 2000 $mW/cm^2$. The UV wavelength may range from approximately 100 nanometers (nm) to approximately 600 nm. Alternatively, the UV radiation may range from approximately 150 nm to approximately 400 nm. Alternatively, the UV radiation may range from approximately 150 nm to approximately 300 nm. Alternatively, the UV radiation may range from approximately 170 nm to approximately 240 nm. Alternatively, the UV radiation may range from approximately 200 nm to approximately 240 nm. For example, the UV radiation source may include a direct current (DC) or pulsed lamp, such as a Deuterium ($D_2$) lamp, having a spectral output ranging from approximately 180 nm to approximately 500 nm, or the UV radiation source may include a semiconductor laser (diode), (nitrogen) gas laser, frequency-tripled (or quadrupled) Nd:YAG laser, or copper vapor laser.

The IR radiation source, or the UV radiation source, or both, may include any number of optical device to adjust one or more properties of the output radiation. For example, each source may further include optical filters, optical lenses, beam expanders, beam collimators, etc. Such optical manipulation devices as known to those skilled in the art of optics and EM wave propagation are suitable for the invention.

As shown in FIGS. 14A and 14B, the first radiation source grouping of EM radiation enters process chamber 1410 through a first optical window 1441. The second radiation source grouping of EM radiation enters process chamber 1410 through a second optical window 1446. As described above, the composition of the optical window may be selected to optimize transmission of the respective EM radiation.

The substrate holder 1420 can further include a temperature control system that can be configured to elevate and/or control the temperature of substrate 1425. The temperature control system can be a part of a thermal treatment device 1430. The substrate holder 1420 can include one or more conductive heating elements embedded in substrate holder 1420 coupled to a power source and a temperature controller. For example, each heating element can include a resistive heating element coupled to a power source configured to supply electrical power. The substrate holder 1420 could optionally include one or more radiative heating elements. The temperature of substrate 1425 can, for example, range from approximately 20 degrees C. to approximately 600 degrees C., and desirably, the temperature may range from approximately 100 degrees C. to approximately 600 degrees C. For example, the temperature of substrate 1425 can range from approximately 300 degrees C. to approximately 500 degrees C., or from approximately 350 degrees C. to approximately 450 degrees C.

The substrate holder 1420 can further include a drive system 1430 configured to vertically translate and rotate the substrate holder 1420 to move the substrate 1425 via piston member 1432 relative to the first radiation source 1440. The substrate holder 1420 further comprises a set of lift pins 1422 that are fixedly attached to process chamber 1410. As the substrate holder 1420 vertically translates, the set of lift pins 1422 may extend through the substrate holder 1420 to lift substrate 1425 to and from an upper surface of the substrate holder 1420.

As illustrated in FIG. 18A, the substrate holder 1420 may be vertically translated to a first position, wherein substrate 1425 may be lifted from the upper surface of substrate holder 1420. In the first position, the substrate 1425 may be exposed to the second radiation source grouping of EM radiation. Alternatively, substrate 1425 may be vertically translated to any position for exposure to the second radiation source grouping of EM radiation. Furthermore, in the first position, the substrate 1425 may be transferred into and out of the process chamber 1410 through transfer opening 1412.

As illustrated in FIG. 18B, the substrate holder 1420 may be vertically translated to a second position, wherein the set of lift pins 1422 no longer extend through the substrate holder 1420. In the second position, the substrate 1425 may be exposed to the first radiation source grouping of EM radiation. Additionally, the substrate 1425 may be rotated during exposure. Furthermore, the substrate 1425 may be heated before, during, or after the exposure to the first radiation source grouping of EM radiation. Alternatively, substrate 1425 may be vertically translated to any position for exposure to the first radiation source grouping of EM radiation.

Additionally, the substrate holder 1420 may or may not be configured to clamp substrate 1425. For instance, substrate holder 1420 may be configured to mechanically or electrically clamp substrate 1425.

Referring again to FIGS. 18A and 18B, process module 1400 can further include a gas injection system 1450 coupled to the process chamber 1410 and configured to introduce a purge gas to process chamber 1410. The purge gas can, for example, include an inert gas, such as a noble gas or nitrogen. Alternatively, the purge gas can include other gases, such as for example $O_2$, $H_2$, $NH_3$, $C_xH_y$, or any combination thereof. Additionally, process module 1400 can further include a vacuum pumping system 1455 coupled to process chamber 1410 and configured to evacuate the process chamber 1410. During a curing process, substrate 1425 can be subject to a purge gas environment with or without vacuum conditions.

The process module 1400 may further comprise an in-situ metrology system (not shown) coupled to the process chamber 1410, and configured to measure a property of the dielectric film on the substrate 1425. The in-situ metrology system may comprise a laser interferometer.

Furthermore, as shown in FIGS. 18A and 18B, process module 1400 can include a controller 1460 coupled to process chamber 1410, substrate holder 1420, thermal treatment device 1435, drive system 1430, first radiation source 1440, second radiation source 1445, gas injection system 1450, and vacuum pumping system 1455. Controller 1460 includes a microprocessor, a memory, and a digital I/O port capable of generating control voltages sufficient to communicate and activate inputs to the process module 1400 as well as monitor outputs from the process module 1400. A program stored in the memory is utilized to interact with the process module 1400 according to a stored process recipe. The controller 1460 can be used to configure any number of processing elements (1410, 1420, 1430, 1435, 1440, 1445, 1450, or 1455), and the controller 1460 can collect, provide, process, store, and display data from processing elements. The controller 1460 can include a number of applications for controlling one or more of the processing elements. For example, controller 1460 can include a graphic user interface (GUI) component (not shown) that can provide easy to use interfaces that enable a user to monitor and/or control one or more processing elements.

According to another example, a method of preparing a porous low-k dielectric film on a substrate is described. The method comprises: forming a SiCOH-containing dielectric film on a substrate using a chemical vapor deposition (CVD) process, wherein the CVD process uses diethoxymethylsilane (DEMS) and a pore-generating material; exposing the SiCOH-containing dielectric film to IR radiation for a first time duration sufficiently long to substantially remove the pore-generating material; exposing the SiCOH-containing dielectric film to UV radiation for a second time duration following the IR exposure; and heating the SiCOH-containing dielectric film during part or all of said second time duration.

The exposure of the SiCOH-containing dielectric film to IR radiation can comprise IR radiation with a wavelength ranging from approximately 9 microns to approximately 10 microns (e.g., 9.4 microns). The exposure of the SiCOH-containing dielectric film to UV radiation can comprise UV radiation with a wavelength ranging from approximately 170 nanometers to approximately 240 nanometers (e.g., 222 nm). The heating of the SiCOH-containing dielectric film can comprise heating the substrate to a temperature ranging from approximately 300 degrees C. to approximately 500 degrees C.

The IR exposure and the UV exposure may be performed in separate process chambers, or the IR exposure and the UV exposure may be performed in the same process chamber.

The pore-generating material may comprise a terpene; a norborene; 5-dimethyl-1,4-cyclooctadiene; decahydronaphthalene; ethylbenzene; or limonene; or a combination of two or more thereof. For example, the pore-generating material may comprise alpha-terpinene (ATRP).

Table 1 provides data for a porous low-k dielectric film intended to have a dielectric constant of about 2.2 to 2.25. The porous low-k dielectric film comprises a porous SiCOH-containing dielectric film formed with a CVD process using a structure-forming material comprising diethoxymethylsilane (DEMS) and a pore-generating material comprising alpha-terpinene (ATRP). The "Pristine" SiCOH-containing dielectric film having a nominal thickness (Angstroms, A) and refractive index (n) is first exposed to IR radiation resulting in a "Post-IR" thickness (A) and "Post-IR" refractive index (n). Thereafter, the "Post-IR" SiCOH-containing dielectric film is exposed to UV radiation while being thermally heated resulting in a "Post-UV+Heating" thickness (A) and "Post-UV+Heating" refractive index (n).

TABLE 1

| Pristine | | Post-IR | | UV + Heating | | Shrinkage | | | | | |
|---|---|---|---|---|---|---|---|---|---|---|---|
| Thickness (A) | n | Thickness (A) | n | Thickness (A) | n | Post-IR (%) | Post-UV (%) | UV (nm) | Time (min) | k | E (GPa) |
| 5860 | 1.498 | 5609 | 1.282 | 4837 | 1.34 | 4.3 | 17.5 | 172 | 10 | 2.29 | 5.37 |
| 5880 | 1.495 | 5644 | 1.291 | 5335 | 1.309 | 4 | 9.3 | 222 | 5 | 2.09 | 3.69 |
| 5951 | 1.492 | 5651 | 1.28 | 5285 | 1.309 | 5 | 11.2 | 222 | 10 | 2.11 | 4.44 |

Referring still to Table 1, the shrinkage (%) in film thickness is provided Post-IR and Post-UV+Heating. Additionally, the UV wavelength and UV exposure time (minutes, min) are provided. Furthermore, the dielectric constant (k) and the elastic modulus (E) (GPa) are provided for the resultant, cured porous low-k dielectric film. As shown in Table 1, the use of IR radiation preceding UV radiation and heating leads to dielectric constants less than 2.3 and as low as 2.09. Moreover, a low dielectric constant, i.e., k=2.11, can be achieved while acceptable mechanical properties, i.e., E=4.44 GPa, can also be achieved.

For comparison purposes, SiCOH-containing dielectric films, formed using the same CVD process, were cured without exposure to IR radiation. Without IR exposure, the "Post-UV+Heating" refractive index ranges from about 1.408 to about 1.434, which is significantly higher than the results provided in Table 1. The higher refractive index may indicate an excess of residual pore-generating material in the film, e.g., less porous film, and/ot oxidation of the film.

According to yet another example, a method of preparing a porous low-k dielectric film on a substrate is described. The method comprises: forming a SiCOH-containing dielectric film on a substrate using a chemical vapor deposition (CVD) process, wherein the CVD process uses diethoxymethylsilane (DEMS) and a pore-generating material; exposing the SiCOH-containing dielectric film to first IR radiation for a first time duration sufficiently long to substantially remove the pore-generating material; exposing the SiCOH-containing dielectric film to UV radiation for a second time duration following the first IR exposure; exposing the SiCOH-containing dielectric film to second IR radiation for a third time duration during the UV exposure; and exposing the SiCOH-containing dielectric film to third IR radiation for a fourth time duration following the UV exposure.

The method may further comprise heating the SiCOH-containing dielectric film during part or all of the second time duration. Additionally, the second time duration may coincide with the second time duration.

The exposure of the SiCOH-containing dielectric film to first IR radiation can comprise IR radiation with a wavelength ranging from approximately 9 microns to approximately 10 microns (e.g., 9.4 microns). The exposure of the SiCOH-containing dielectric film to UV radiation can comprise UV radiation with a wavelength ranging from approximately 170 nanometers to approximately 230 nanometers (e.g., 222 nm). The exposure of the SiCOH-containing dielectric film to second IR radiation can comprise IR radiation with a wavelength ranging from approximately 9 microns to approximately 10 microns (e.g., 9.4 microns). The exposure of the SiCOH-containing dielectric film to third IR radiation can comprise IR radiation with a wavelength ranging from approximately 9 microns to approximately 10 microns (e.g., 9.4 microns). The heating of the SiCOH-containing dielectric film can comprise heating the substrate to a temperature ranging from approximately 300 degrees C. to approximately 500 degrees C.

The pore-generating material may comprise a terpene; a norborene; 5-dimethyl-1,4-cyclooctadiene; decahydronaphthalene; ethylbenzene; or limonene; or a combination of two or more thereof. For example, the pore-generating material may comprise alpha-terpinene (ATRP).

Table 2 provides data for a porous low-k dielectric film intended to have a dielectric constant of about 2.2 to 2.25. The porous low-k dielectric film comprises a porous SiCOH-containing dielectric film formed with a CVD process using a structure-forming material comprising diethoxymethylsilane (DEMS) and a pore-generating material comprising alpha-terpinene (ATRP). The "Pristine" SiCOH-containing dielectric film having a nominal thickness (Angstroms, A) and refractive index (n) is cured using two processes, namely: (1) a conventional UV/Thermal process (i.e., no IR exposure); and (2) a curing process wherein the pristine film is exposed to IR radiation (9.4 micron), followed by exposure to IR radiation (9.4 micron) and UV radiation (222 nm), followed by exposure to IR radiation (9.4 micron).

TABLE 2

| Pristine | | | | | | | |
|---|---|---|---|---|---|---|---|
| Thickness (A) | n | Thickness (A) | n | Shrinkage Post-(%) | k | E (GPa) | H (GPa) |
| | | Post-UV/Thermal | | | | | |
| 6100 | 1.495 | 5350 | 1.329 | 13 | 2.2 | 4.51 | 0.45 |
| | | Post-IR + UV/IR + IR | | | | | |
| 6137 | 1.488 | 5739 | 1.282 | 6.5 | 2.1 | 3.99 | 0.28 |
| 6107 | 1.5 | 5473 | 1.297 | 10.4 | 2.1 | 4.26 | 0.35 |
| 6173 | 1.498 | 5483 | 1.302 | 11.2 | 2.1 | 4.71 | 0.46 |
| 6135 | 1.499 | 5374 | 1.306 | 12.4 | 2.1 | 4.78 | 0.48 |

Table 2 provides the "Post-UV/Thermal" thickness (A) and "Post-UV/Thermal" refractive index (n) for the conventional UV/Thermal process, and the "Post-IR+UV/IR+IR" thickness (A) and "Post-IR+UV/IR+IR" refractive index (n) for the IR+UV/IR+IR process. Additionally, the shrinkage (%) in film thickness is provided Post-UV/Thermal and Post-IR+UV/IR+IR. Furthermore, the dielectric constant (k), the elastic modulus (E) (GPa) and the hardness (H) (GPa) are provided for the resultant, cured porous low-k dielectric film. As shown in Table 2, the use of IR radiation preceding UV radiation and heating, as well as during and after the UV exposure, leads to dielectric constants less than 2.1. Moreover, a low dielectric constant, i.e., k=2.1, can be achieved while acceptable mechanical properties, i.e., E=4.71 GPa and H=0.46 GPa, can also be achieved. Comparatively speaking, the IR+UV/IR+IR curing process produces a lower dielectric constant (k=2.1) with less film thickness shrinkage. Moreover, the mechanical properties (E and H) are approximately the same for the two curing processes.

As a result, the use of IR exposure and UV exposure can lead to the formation of a diethoxymethylsilane (DEMS)-based, porous dielectric film comprising a dielectric constant of about 2.1 or less, a refractive index of about 1.31 or less, an elastic modulus of about 4 GPa or greater, and a hardness of about 0.45 GPa or greater.

Table 3 provides data for a porous low-k dielectric film intended to have a dielectric constant of about 2. The porous low-k dielectric film comprises a porous SiCOH-containing dielectric film formed with a CVD process using a structure-forming material comprising diethoxymethylsilane (DEMS) and a pore-generating material comprising alpha-terpinene (ATRP). The pristine SiCOH-containing dielectric film is cured using three processes, namely: (1) a conventional UV/Thermal process (i.e., no IR exposure); (2) a curing process wherein the pristine film is exposed to IR radiation only (9.4 micron); (3) a curing process wherein the pristine film is exposed to IR radiation (9.4 micron) followed by a conventional UV/Thermal process; and (4) a curing process wherein the pristine film is exposed to IR radiation (9.4 micron), followed by exposure to IR radiation (9.4 micron) and UV radiation (222 nm), followed by exposure to IR radiation (9.4 micron).

TABLE 3

| Process type | n | Shrinkage (%) | k | E (GPa) | H (GPa) |
| --- | --- | --- | --- | --- | --- |
| UV/Thermal | 1.275 | 33 | 1.92 | 2.52 | 0.28 |
| IR only | 1.174 | 15 | 1.66 | 1.2 | 0.1 |
| IR + UV/Thermal | 1.172 | 29 | 1.65 | 2.4 | 0.33 |
| IR + UV/IR + IR | 1.172 | 26 | 1.68 | 2.34 | 0.28 |
|  | 1.164 | 29 | 1.66 | 2.08 | 0.25 |

Table 3 provides the resulting refractive index (n), shrinkage (%), dielectric constant (k), elastic modulus (E) (GPa) and hardness (H) (GPa) following each of the curing processes. As shown in Table 3, the use of IR radiation (with or without UV radiation) leads to a dielectric constant less than 1.7 (as opposed to greater than 1.9). When using only IR radiation to cure the pristine film, a low dielectric constant, i.e., k=1.66, can be achieved while acceptable mechanical properties, i.e., E=1.2 GPa and H=0.1 GPa, can also be achieved. However, when using IR radiation and UV radiation to cure the pristine film, a low dielectric constant, i.e., k=1.68, can be achieved while improved mechanical properties, i.e., E=2.34 GPa and H=0.28 GPa, can also be achieved. Additionally, the curing processes using IR radiation produce a lower dielectric constant (k=1.66 to 1.68) with less film thickness shrinkage. Further, when IR radiation is used, the mechanical properties (E and H) can be improved by using UV radiation.

As a result, the use of IR exposure and UV exposure can lead to the formation of a diethoxymethylsilane (DEMS)-based, porous dielectric film comprising a dielectric constant of about 1.7 or less, a refractive index of about 1.17 or less, an elastic modulus of about 1.5 GPa or greater, and a hardness of about 0.2 GPa or greater.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A process module for treating a dielectric film on a substrate, comprising:
    process chamber;
    a substrate holder coupled to said process chamber and configured to support a substrate;
    an infrared (IR) radiation source coupled to said process chamber and configured to expose said dielectric film to IR radiation, wherein said IR radiation source comprises one or more IR lasers configured to produce one or more IR beams;
    an IR optics system having a beam sizing device configured to enlarge a beam diameter of at least one of said one or more IR beams to produce an enlarged beam spot size on said substrate; and
    a radiation scanning device coupled to said process chamber, and configured to displace said one or more IR beams from said IR radiation source and to scan said one or more IR beams from said IR radiation source across said substrate,
    wherein said radiation scanning device is configured to displace and scan said one or more IR beams across said substrate in a first lateral direction and a second lateral direction, said second lateral direction being different than said first lateral direction.

2. The process module of claim 1, wherein said substrate holder is configured to support a plurality of substrates.

3. The process module of claim 1, further comprising:
    a drive system coupled to said substrate holder, and configured to translate, or rotate, or both translate and rotate said substrate holder; and
    a motion control system coupled to said drive system, and configured to perform at least one of monitoring a position of said substrate, adjusting said position of said substrate, or controlling said position of said substrate.

4. The process module of claim 1, wherein said IR radiation source comprises an IR wave-band source ranging from approximately 8 microns to approximately 14 microns.

5. The process module of claim 1, wherein said IR radiation source comprises one or more $CO_2$ lasers.

6. The process module of claim 1, further comprising:
    a scanning motion control system coupled to said radiation scanning device, and configured to perform at least one of monitoring a position of said one or more IR beams, adjusting said position of said one or more IR beams, or controlling said position of said one or more IR beams.

7. The process module of claim 1, wherein said IR radiation source further comprises:
    a plurality of IR lasers,
    wherein said IR optics system is further configured to receive a plurality of IR beams from said plurality of IR lasers, combine two or more of said plurality of IR beams from said plurality of IR lasers into a collective IR beam, and illuminate at least a portion of said substrate in said process chamber with said collective IR beam.

8. The process module of claim 1, wherein said IR optics system further comprises:
    a beam shaping device configured to shape at least one of said one or more IR beams.

9. The process module of claim 8, wherein said IR optics system is configured to size, or shape, or both size and shape said one or more IR beams into an IR sheet, and wherein said radiation scanning device is configured to scan said IR sheet across said substrate.

10. The process module of claim 1, wherein said radiation scanning device comprises one or more rotating mirrors, or one or more translating mirrors, or both one or more rotating mirrors and one or more translating mirrors.

11. The process module of claim 1, wherein said radiation scanning device comprises one or more mirror galvanometers.

12. The process module of claim 1, further comprising:
an ultraviolet (UV) radiation source coupled to said process chamber and configured to expose said dielectric film to UV radiation,
wherein said UV radiation source comprises a UV waveband source containing emission ranging from approximately 150 nanometers to approximately 400 nanometers.

13. The process module of claim 12, wherein said UV radiation source comprises one or more UV lamps.

14. The process module of claim 12, further comprising:
one or more windows through which said IR radiation, or said UV radiation, or both passes into said process chamber to illuminate said substrate.

15. The process module of claim 14, wherein said one or more windows comprises sapphire, $MgF_2$, $BaF_2$, $CaF_2$, ZnS, Ge, GaAs, ZnSe, KCl, or $SiO_2$, or any combination of two or more thereof.

16. The process module of claim 1, further comprising:
a temperature control system coupled to said process chamber and configured to control a temperature of said substrate.

17. The process module of claim 16, wherein said temperature control system comprises a resistive heating element coupled to said substrate holder, and wherein said temperature control system is configured to control said resistive heating element to elevate said temperature of said substrate to a value ranging from approximately 100 degrees C. to approximately 600 degrees C.

18. The process module of claim 1, further comprising:
a gas supply system coupled to said process chamber, and configured to introduce a process gas to said process chamber, and wherein said gas supply system is configured to supply a reactive gas, an inert gas, or both to said process chamber; and
a vacuum pumping system coupled to said process chamber, and configured to evacuate said process chamber.

19. The process module of claim 18, wherein said gas supply system is configured to supply nitrogen gas to said process chamber.

20. The process module of claim 1, further comprising:
an in-situ metrology system coupled to said process chamber, and configured to measure a property of said dielectric film on said substrate.

21. The process module of claim 1, wherein said second lateral direction is orthogonal to said first lateral direction.

22. The process module of claim 1, wherein at least one of said one or more IR beams is polarized to produce a polarized IR beam for irradiation on said substrate.

23. The process module of claim 1, further comprising:
a polarizing beam splitter arranged to polarize at least one of said one or more IR beams.

24. The process module of claim 1, further comprising:
a polarizing beam splitter arranged to combine two or more of said one or more IR beams into a collective, polarized IR beam for irradiation on said substrate.

25. The process module of claim 1, further comprising:
a controller coupled to said substrate holder, said IR radiation source, said IR optics system, and said radiation scanning device, and configured to controllably operate said process module in accordance with a stored process recipe to treat a low-k dielectric film on said substrate with said IR radiation.

26. The process module of claim 25, wherein said controller executes said stored process recipe to control one or more processing elements in said process module to cause breakage of chemical bonds and/or dissociation of molecular side groups in said low-k dielectric film on said substrate.

27. The process module of claim 25, wherein said controller is configured to control one or more process parameters selected from the group consisting of an IR beam intensity, an IR beam size, and a time duration for exposure of at least a portion of said substrate to said IR radiation.

28. The process module of claim 1, further comprising:
a controller coupled to said IR radiation source, and configured to generate control voltages sufficient to pulse said IR radiation.

29. The process module of claim 1, wherein said IR radiation source, said IR optics system, and said radiation scanning device are configured to illuminate a first region on said substrate with a first IR beam and illuminate a second region on said substrate with a second IR beam, and wherein said first region does not overlap with said second region, or said first region partially overlaps with said second region.

30. The process module of claim 1, wherein said IR radiation source, said IR optics system, and said radiation scanning device are configured to produce four IR beams to illuminate four regions on said substrate, each of said four IR beams is uniquely dedicated to a quadrant of said substrate.

* * * * *